(12) United States Patent
Obana et al.

(10) Patent No.: US 11,815,793 B2
(45) Date of Patent: Nov. 14, 2023

(54) ELECTRONIC APPARATUS INCLUDING IMAGE CAPTURING UNIT CONFIGURED TO BE MOVABLE

(71) Applicant: CANON KABUSHIKI KAISHA, Tokyo (JP)

(72) Inventors: Shinji Obana, Tokyo (JP); Koichi Odagaki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 39 days.

(21) Appl. No.: 17/486,094

(22) Filed: Sep. 27, 2021

(65) Prior Publication Data

US 2022/0100060 A1   Mar. 31, 2022

(30) Foreign Application Priority Data

Sep. 29, 2020  (JP) ................................ 2020-163800

(51) Int. Cl.
| | |
|---|---|
| *G03B 17/56* | (2021.01) |
| *H05K 1/18* | (2006.01) |
| *G03B 17/12* | (2021.01) |
| *H04N 23/51* | (2023.01) |
| *H04N 23/55* | (2023.01) |

(52) U.S. Cl.
CPC ........... *G03B 17/561* (2013.01); *G03B 17/12* (2013.01); *H04N 23/51* (2023.01); *H04N 23/55* (2023.01); *H05K 1/181* (2013.01); *H05K 2201/10151* (2013.01)

(58) Field of Classification Search
CPC ...... G03B 17/561; G03B 17/12; G03B 17/02; H04N 23/51; H04N 23/55; H05K 1/181; H05K 2201/10151
See application file for complete search history.

(56) References Cited

U.S. PATENT DOCUMENTS

| | | | |
|---|---|---|---|
| 7,420,136 B2 * | 9/2008 | Goetzl | .................. H01H 13/06 |
| | | | 200/341 |
| 8,493,742 B2 * | 7/2013 | Li | .......................... H01H 13/14 |
| | | | 361/752 |

(Continued)

FOREIGN PATENT DOCUMENTS

| | | |
|---|---|---|
| JP | 07-235777 A | 9/1995 |
| JP | 2002-369038 A | 12/2020 |

*Primary Examiner* — Jason A Flohre
(74) *Attorney, Agent, or Firm* — Cowan, Liebowitz & Latman, P.C.

(57) ABSTRACT

An electronic apparatus includes a chassis unit, a movable section rotatably held by the chassis unit, and a circuit board assembly on which circuit components including a tall electronic component are mounted. The chassis unit includes a pan driving unit that drives the movable section, and a pan position detection unit that detects an amount of rotation of the movable section. The chassis unit and the circuit board assembly are arranged such that they are opposed to each other in a first direction perpendicular to an installation surface of the electronic apparatus. The tall electronic component is mounted on a mounting surface, opposed to the chassis unit, of the circuit board assembly, and mounted at a location where in a projection view in the first direction, the tall electronic component does not overlap the pan driving unit and the panning detection unit.

15 Claims, 13 Drawing Sheets

(56) References Cited

U.S. PATENT DOCUMENTS

| | | | |
|---|---|---|---|
| 8,748,766 B2* | 6/2014 | Han | H01H 13/06 200/302.1 |
| 9,251,975 B1* | 2/2016 | Brandau | H01H 13/14 |
| 11,412,149 B1* | 8/2022 | Gandhi | H04N 23/687 |
| 2001/0013466 A1* | 8/2001 | Yanai | H01H 13/48 200/341 |
| 2005/0088571 A1* | 4/2005 | Wei | F16M 11/2014 348/E5.025 |
| 2005/0133355 A1* | 6/2005 | Shimoda | B60Q 3/82 200/341 |
| 2005/0206779 A1* | 9/2005 | Aoki | G08B 13/1963 348/E5.025 |
| 2005/0243170 A1* | 11/2005 | Chang | F16M 11/2014 348/143 |
| 2006/0269278 A1* | 11/2006 | Kenoyer | H04N 23/695 396/428 |
| 2007/0264849 A1* | 11/2007 | Steckler | G01R 31/69 29/721 |
| 2008/0008467 A1* | 1/2008 | Liu | H04N 23/50 396/427 |
| 2008/0138049 A1* | 6/2008 | Berkey | G08B 13/1963 388/811 |
| 2009/0301853 A1* | 12/2009 | Yang | H01H 21/22 200/343 |
| 2013/0161168 A1* | 6/2013 | Botez | H01H 9/20 200/341 |
| 2013/0180837 A1* | 7/2013 | Hirata | H01H 13/81 200/294 |
| 2015/0078737 A1* | 3/2015 | Albonico | G03B 19/026 396/48 |
| 2015/0130668 A1* | 5/2015 | Lo Hine Tong | H01Q 9/42 343/702 |
| 2015/0207964 A1* | 7/2015 | Bye | H04N 23/685 348/374 |
| 2018/0358192 A1* | 12/2018 | Kohn | H01H 13/88 |

* cited by examiner

ELECTRONIC APPARATUS INCLUDING IMAGE CAPTURING UNIT CONFIGURED TO BE MOVABLE

BACKGROUND OF THE INVENTION

Field of the Invention

The present invention relates to an electronic apparatus, and more particularly to an image capturing apparatus having an image capturing unit configured to be movable.

Description of the Related Art

In recent years, a system has become widespread in which an image capturing apparatus installed at a predetermined location and a smartphone or a personal computer terminal (hereinafter referred to as the "external display terminal") are connected by wireless communication to enable a user to confirm a video captured by the image capturing apparatus on the external display terminal at a location remote from the image capturing apparatus. By combining the image recognition technology, the AI (artificial intelligence) technology or the like for an image obtained by the image capturing apparatus, with this system, it is possible to realize various services. Examples of the various services include an outdoor work assisting service for monitoring the progress of work and the health condition of workers in a field of construction work and a care support service for preventing an elderly person from forgetting or failing to take a regular medicine or taking a wrong medicine, in a care facility for the elderly.

As an image capturing apparatus used for the above-described system, Japanese Laid-Open Patent Publication (Kokai) No. 2002-369038 has proposed an image capturing apparatus that is capable of changing an image capturing direction by rotating an image capturing section about two axes orthogonal to each other. More specifically, the image capturing apparatus described in Japanese Laid-Open Patent Publication (Kokai) No. 2002-369038 has a structure in which a horizontal rotation section is disposed such that the horizontal rotation section is rotatable in a panning direction with respect to a fixed section, and the image capturing section including an image capturing device and a vertical rotation section for rotating the image capturing section in a tilting direction are provided inside the horizontal rotation section.

Not only the image capturing apparatus described in the above-described publication, but also an image capturing apparatus used for the above-described system is demanded to reduce a projected installation area of the image capturing apparatus and also reduce the height dimension thereof. Note that reduction of the projected installation area of the image capturing apparatus refers to reduction of an area of the image capturing apparatus, as viewed from a direction perpendicular to its installation surface. Further, reduction of the height dimension of the image capturing apparatus refers to reduction of the length of the image capturing apparatus in the direction perpendicular to the installation surface of the image capturing apparatus.

SUMMARY OF THE INVENTION

The present invention provides an electronic apparatus that is provided with an image capturing unit configured to be movable and is reduced in a projected installation area of the electronic apparatus and further reduced in the height dimension of the same.

In a first aspect of the present invention, there is provided an electronic apparatus including a mounting base unit, a movable section rotatably held by the mounting base unit, and a circuit board unit on which circuit components including a tall electronic component are mounted, wherein the mounting base unit includes a drive unit configured to drive the movable section, and a detection unit configured to detect an amount of rotation of the movable section, wherein the mounting base unit and the circuit board unit are arranged such that the mounting base unit and the circuit board unit are opposed to each other in a first direction perpendicular to an installation surface of the electronic apparatus, and wherein the tall electronic component is mounted on a mounting surface, which is opposed to the mounting base unit, of the circuit board unit, and the tall electronic component is mounted at a location where in a projection view in the first direction, the tall electronic component does not overlap the drive unit and the detection unit.

In a second aspect of the present invention, there is provided an electronic apparatus including a circuit board having a plurality of push-in switches mounted on the same surface thereof, an exterior member that accommodates the circuit board, and a plurality of operation buttons that are mounted on the exterior member in one-to-one relation with the plurality of push-in switches, each for pushing in an associated one of the push-in switches, wherein the circuit board has a first hole, wherein the exterior member has a first column portion inserted through the first hole, wherein the plurality of push-in switches each have a pushed portion that detects an operation of pushing in an associated one of the operation buttons, wherein directions in which the plurality of push-in switches are pushed in are parallel to a mounting surface of the circuit board, and also tip ends of the pushed portions of the plurality of push-in switches are positioned in a straight line, and wherein the first hole is formed at a location where at least part of the first hole crosses the straight line in an area between two push-in switches, which are arranged in a central portion, of the plurality of push-in switches.

According to the present invention, it is possible to provide an electronic apparatus that is reduced in the projected installation area and in the height dimension thereof.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof. Here, a description will be given of an image capturing apparatus as an electronic apparatus according to the present invention.

Figure 1:
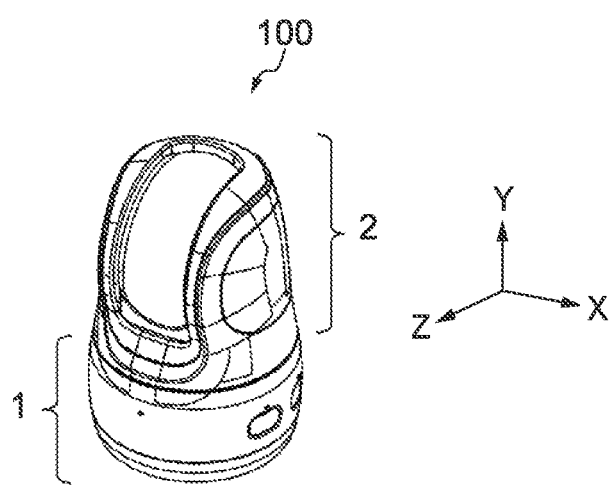
FIG. 1 is a perspective view of an image capturing apparatus as an electronic apparatus according to a first embodiment of the present invention.
Figure 2:
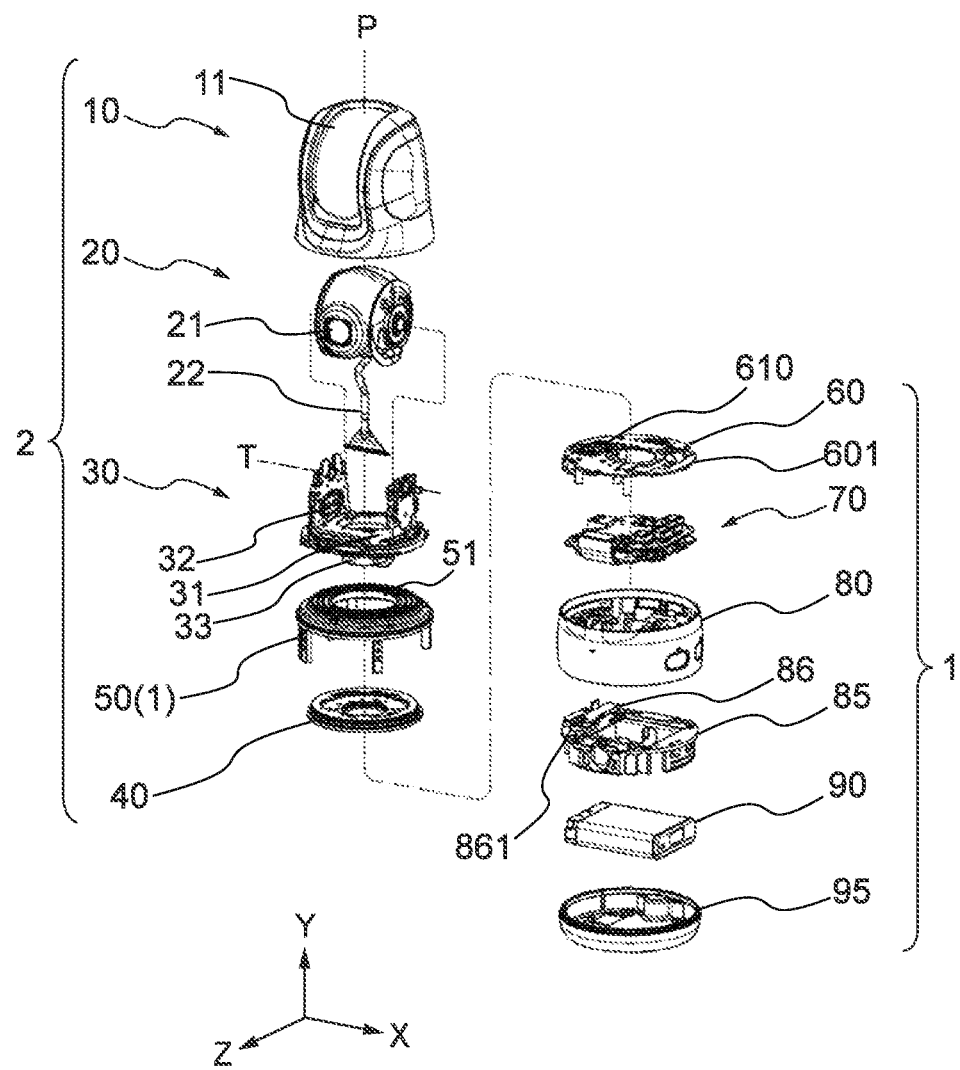
FIG. 2 is an exploded perspective view of the image capturing apparatus shown in FIG. 1.

FIG. 1 is a perspective view of an image capturing apparatus 100 as an electronic apparatus according to a first embodiment of the present invention. FIG. 2 is an exploded perspective view of the image capturing apparatus 100. As shown in FIG. 1, the image capturing apparatus 100 is roughly comprised of a fixed section 1 and a movable section 2.

A three-dimensional orthogonal coordinate system is set as shown in FIGS. 1 and 2 for convenience of explanation. A Z-axis direction is a direction parallel to an optical axis of an image capturing optical system (lens barrel unit 21), described hereinafter, arranged in the movable section 2, and is a front-rear direction of the image capturing apparatus 100 in a state in which the movable section 2 is in a home position with respect to the fixed section 1. An X-axis direction is, in a case where the Z-axis direction is in a horizontal plane, a direction orthogonal to the Z-axis direction within the horizontal plane, and is a right-left direction of the image capturing apparatus 100 in the state in which the movable section 2 is in the home position with respect to the fixed section 1. A Y-axis direction is a direction orthogonal to the X-axis direction and the Z-axis direction and is a height direction (vertical direction) of the image capturing apparatus 100. Note that the right and left of the image capturing apparatus 100 are defined in a state in which the image capturing apparatus 100 is viewed from the front.

The movable section 2 is disposed on an upper side (side in the +Y-axis direction) of the fixed section 1. The fixed section 1 includes a base cover 50, a chassis unit 60 (mounting base unit), a circuit board assembly 70 (circuit board unit), a middle cover 80, a battery box 85, a battery 90, and a bottom cover 95. The movable section 2 includes a top cover 10, a tilt unit 20, a panning unit-mounting base 30, and a panning unit-rotating plate 40. The movable section 2 is held by the fixed section 1 such that the movable section 2 is capable of performing horizontal rotation operation (panning operation) about a pan rotation axis P parallel to the vertical direction.

The top cover 10 has a dome portion 11 formed of a transparent resin material, such as acrylic resin. The top cover 10 is fixed to the panning unit-mounting base 30 with a plurality of screws. The tilt unit 20 is arranged inside the top cover 10, and is held by the panning unit-mounting base 30 such that the tilt unit 20 is capable of performing vertical rotation operation (tilting) about a tilt rotation axis T. Note that the pan rotation axis P and the tilt rotation axis T are in relation orthogonal to each other.

The lens barrel unit 21 having the image capturing optical system is arranged inside the tilt unit 20, and an image capturing device (not shown) is arranged inside the lens barrel unit 21. The image capturing device is comprised of a photoelectric conversion element, such as a CCD sensor or a CMOS sensor, a lowpass filer, and so forth. The lowpass filter reduces incidence of infrared rays and suppresses occurrence of color moire and the like. The image capturing device is mounted on a printed circuit board (not shown) together with other electronic components, and one end of a bundled wire 22 (third wiring member) is electrically connected to this printed circuit board. The bundled wire 22 is comprised of e.g. a plurality of wires having flexibility, each formed by covering a conductor core wire with an insulator, connectors connected to opposite ends of these wires, and an adhesive tape binding these wires at intervals of a predetermined length. As the wire used for the bundled wire 22, a coaxial cable formed by an internal conductor, an insulator, an external conductor, and a protective coating film may be employed on an as needed basis. The other end of the bundled wire 22 is connected to the circuit board assembly 70 disposed in the fixed section 1. Since the bundled wire 22 is formed by using the wires having flexibility, the bundled wire 22 can follow the movement of the movable section 2 driven for panning or tilting with respect to the fixed section 1.

In the tilt unit 20, the lens barrel unit 21 has a pair of shaft portions formed in opposite sides (sides in a direction parallel to the tilt rotation axis T) thereof, respectively. Further, the panning unit-mounting base 30 is provided with a pair of bearing portions for supporting the pair of shaft portions of the tilt unit 20, around the tilt rotation axis T. These shaft portions and bearing portions are slidably fitted to each other, whereby the tilt unit 20 is held such that the tilt unit 2 is rotatable about the tilt rotation axis T with respect to the panning unit-mounting base 30.

The panning unit-mounting base 30 is formed with an annular hollow rotational shaft 33 of which the central axis is the pan rotation axis P. Further, the base cover 50 is provided with a hollow cylindrical portion 51 which is slidably fitted on the hollow rotational shaft 33, with the pan rotation axis P as its central axis. The panning unit-mounting base 30 and the panning unit-rotating plate 40 are assembled to each other such that the panning unit-mounting base 30 and the panning unit-rotating plate 40 sandwich the base cover 50 in the axial direction of the pan rotation axis P in a state in which the hollow rotational shaft 33 and the hollow cylindrical portion 51 are slidably fitted to each other. Thus, the panning unit-mounting base 30 and the panning unit-rotating plate 40 are held by the base cover 50 such that the panning unit-mounting base 30 and the panning unit-rotating plate 40 are rotatable about the hollow rotational shaft 33 (pan rotation axis P).

The panning unit-mounting base 30 includes a flexible circuit board 31 and a tilt driving unit 32 electrically connected to one end of the flexible circuit board 31. The other end of the flexible circuit board 31 is electrically connected to the circuit board assembly 70 arranged in the fixed section 1. The flexible circuit board 31 is configured to be movable while following the movement of the panning unit-mounting base 30 driven for panning with respect to the fixed section 1. The tilt driving unit 32 outputs a driving force for driving the tilt unit 20 for tilting (rotation about the tilt rotation axis T) according to a predetermined drive signal input from the circuit board assembly 70.

The chassis unit 60 is fixed to the base cover 50 with screws, not shown. The chassis unit 60 is a mounting base unit including a base chassis 601 (mounting base), a plurality of metal posts, a pan driving unit 610, and a pan position detection unit 620.

The base chassis 601 is a mounting base formed of a metal material, such as aluminum or stainless-steel material (SUS material), and formed into a substantially annular shape having a central opening, referred to hereinafter, e.g. by pressing, drawing, or the like. The plurality of metal posts are each formed of a metal material, such as a SUS material or brass (BS material), and bonded (fixed) to the base chassis 601. Further, the plurality of metal posts are each subjected to tap processing and can be fastened with a screw.

The pan driving unit 610 has a flexible circuit board, and one end of the flexible circuit board is electrically connected and fixed to the circuit board assembly 70. The pan driving unit 610 outputs a driving force for driving the panning unit-rotating plate 40 for panning (rotation about the pan rotation axis P) according to a predetermined drive signal input from the circuit board assembly 70. Note that details of the configuration of the pan driving unit 610 will be described hereinafter.

The circuit board assembly 70 is fixed to the metal posts of the chassis unit 60 with screws. The base chassis 601 of the chassis unit 60 has a substantially circular central opening formed in a central portion thereof, and the other end side of the bundled wire 22 is inserted through the central opening, whereby the other end of the bundled wire 22 can be connected to the circuit board assembly 70.

The middle cover 80 is fixed to the base cover 50 with screws, not shown. A side surface of the middle cover 80 is provided with a plurality of operation sections which can be pushed (pushed in) from the outside. When a user operates a desired operation section, a key top portion of a tact switch associated therewith mounted on the circuit board assembly 70 is pressed.

Further, the side surface of the middle cover 80 is formed with an opening, and the frontage of a connector mounted on the circuit board assembly 70, for connecting to an external device, can be exposed from this opening. Examples of the connector for connecting to an external device include general-purpose interfaces of a USB standard and an HDMI (registered trademark) standard, but the connector for connecting to an external device is not limited to these.

The middle cover 80 has a structure in which the battery box 85 can be assembled from its bottom side. Inside the battery box 85, a battery accommodating portion for accommodating the battery 90 is formed as a substantially rectangular parallelepiped space. As the battery 90, for example, a battery pack which can be repeatedly charged, such as an alkaline secondary battery or a lithium-ion secondary battery, is employed, but this is not limitative. A flexible circuit board 86 (second wiring member) is assembled in the battery box 85, and a battery connector is mounted on one end of the flexible circuit board 86. The flexible circuit board 86 is assembled in the battery box 85 such that the battery connector is accommodated in the space for accommodating the battery 90. With this, when the battery 90 is attached in the space of the battery box 85, an electrode portion of the battery 90 and the battery connector are electrically connected to each other.

A board-to-board type connector 861 is mounted on the other end of the flexible circuit board 86, and when the connector 861 is connected to the connector mounted on the circuit board assembly 70, the battery 90 and the circuit board assembly 70 are electrically connected to each other. The bottom cover 95 is assembled to the middle cover 80 from its bottom side. The image capturing apparatus 100 is configured as described above.

Figure 3:
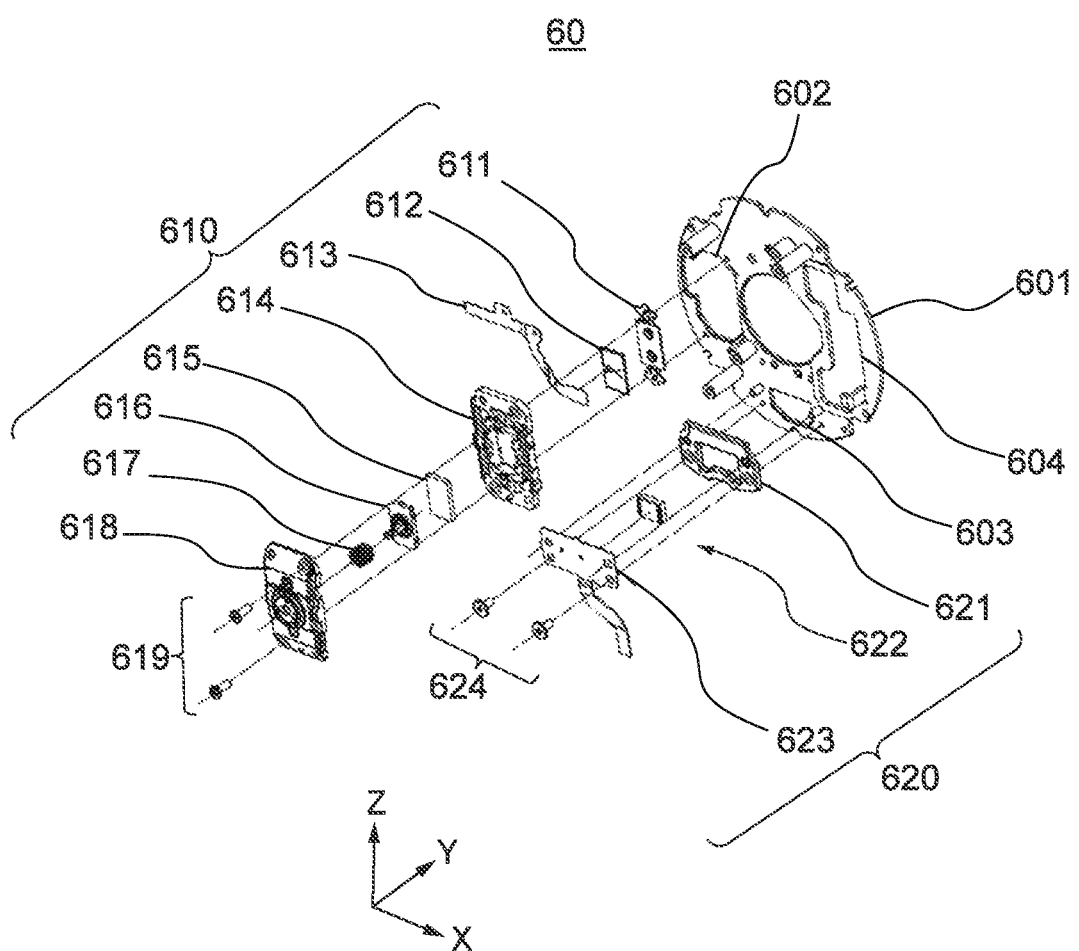
FIG. 3 is an exploded perspective view of a chassis unit of the image capturing apparatus shown in FIG. 1.

Next, the configuration of the chassis unit 60 will be described in detail. FIG. 3 is an exploded perspective view of the chassis unit 60. The chassis unit 60 has the base chassis 601, the pan driving unit 610, the pan position detection unit 620, and the plurality of metal posts. As described above, the base chassis 601 has the central portion formed with the substantially circular central opening. Further, around the central opening of the base chassis 601, three openings, i.e. a first opening 602, a second opening 603, and a third opening 604 are formed. A plurality of portions around the first opening 602 and the second opening 603 are subjected to tap processing, whereby fastening of components to the base chassis 601 with screws can be performed.

The pan driving unit 610 is arranged such that part of the pan driving unit 610 enters the first opening 602, and is fixed to the base chassis 601 with screws. The pan position detection unit 620 is arranged such that part of the pan position detection unit 620 enters the second opening 603, and is fixed to the base chassis 601 with screws. With this, compared with a case where the pan driving unit 610 and the pan position detection unit 620 are fixed to the top side (+Y side) of the base chassis 601, it is possible to make effective use of a space intrinsically occupied by the base chassis 601 and thereby save the space.

The pan driving unit 610 is an actuator, which is so called a ultrasonic motor (vibration actuator), that brings a vibration element and a driven body into contact with each other, and applies a frictional driving force to the driven body by exciting vibration of a predetermined frequency in the vibration element to thereby move the vibration element and the driven body relative to each other. The pan driving unit 610 has a vibration plate 611 as a resilient body which is brought into contact with the panning unit-rotating plate 40 as the driven body, and a piezoelectric element 612 which excites vibration of the predetermined frequency in the vibration plate 611. The vibration plate 611 and the piezoelectric element 612 form the vibration element.

The pan driving unit 610 is provided with a flexible circuit board 613 (one of fourth wiring members) as a wiring member which is bonded to the piezoelectric element 612 to apply a voltage of a predetermined frequency (driving voltage) to the piezoelectric element 612. Further, the pan driving unit 610 is provided with a base member 614 that collectively holds the vibration element and the flexible circuit board 613, a felt 615, a presser 616, a spring 617, a case 618, and screws 619.

The vibration plate 611 is formed of e.g. a SUS material and is fixed to (held by) the base member 614 by welding at a plurality of locations. The pan driving unit 610 is fixed to the base chassis 601 with the screws 619 in a state in which various components are accommodated inside the case 618. The flexible circuit board 613 has one end connected to the piezoelectric element 612 and the other end connected to the circuit board assembly 70. A driving voltage and a control signal are applied from a driver IC mounted on the circuit board assembly 70 to the piezoelectric element 612 via the flexible circuit board 613.

Here, the vibration plate 611 has a plurality of contacts (protrusions) which are brought into contact with the panning unit-rotating plate 40. A driving voltage is applied to the piezoelectric element 612 so as to excite vibration of a predetermined vibration mode in the vibration element. This vibration causes the contacts to give a frictional driving force to the panning unit-rotating plate 40. At this time, a direction in which the contacts provide a frictional driving force to the panning unit-rotating plate 40 is the tangential direction of a circle having the pan rotation axis P as the center. With this, the panning unit-rotating plate 40 is driven for rotation about the pan rotation axis P.

In the vibration actuator, it is necessary to urge the vibration element (contacts) against the driven body with a constant pressure. Further, it is desirable that the plurality of contacts of the vibration plate 611 are equally pressed against and brought into contact with the panning unit-rotating plate 40 in order to increase the driving efficiency and increase the driving stability. For this reason, the pan driving unit 610 is configured such that the spring 617 presses the flexible circuit board 613 and the vibration element via the felt 615 and the presser 616. The presser 616 is disposed inside the base member 614 such that the presser 616 is movable in a direction parallel to the pan rotation axis P and mainly plays the role of widely transferring local surface pressure applied by the spring 617. The felt 615 is disposed between the presser 616 and the flexible circuit board 613 and mainly plays the role of serving as a damping member for preventing vibration generated in the vibration element from being transferred to the presser 616 and the spring 617.

The base member 614 holding the vibration plate 611, the felt 615, the presser 616, and the spring 617 are arranged in the case 618 such that the base member 614, the felt 615, the presser 616, and the spring 617 are layered in the Y-axis direction, and the case 618 is fixed to the base chassis 601. This makes it possible to maintain a uniformly pressurized state of the contacts. Thus, the vibration element of the vibration actuator is always in contact with the panning unit-rotating plate 40 which is the driven body, with a constant pressure force (pressing force).

To make it possible to stably control the driving of the vibration actuator and increase the durability of the vibration actuator, the surfaces of the contacts of the vibration plate 611 (frictional driving surfaces of the vibration plate 611), which are in contact with the panning unit-rotating plate 40, are required to have high flatness and wear resistance. To meet this requirement, the frictional driving surfaces of the contacts are subjected to surface treatment, such as lapping, to form smooth flat surfaces. Further, a surface of the panning unit-rotating plate 40, which receives the frictional driving force from the contacts of the vibration element (frictional drive surface of the panning unit-rotating plate 40), is also required to have high flatness and wear resistance. For this reason, for example, the SUS material is used for the panning unit-rotating plate 40, and also the frictional sliding surface of the panning unit-rotating plate 40 is subjected to hardening such as nitriding and polishing to ensure high flatness and wear resistance.

The processing method for obtaining high flatness and wear resistance for the respective frictional sliding surfaces of the vibration plate 611 and the panning unit-rotating plate 40 is not limited to the above-mentioned methods. For example, as the method for increasing wear resistance, carburizing may be used in which the frictional sliding surface is hardened by adding carbon thereto. Note that the tilt driving unit 32 mounted on the panning unit-mounting base 30 is formed by components equivalent to those of the pan driving unit 610, and hence detailed description thereof is omitted.

Figure 4A:
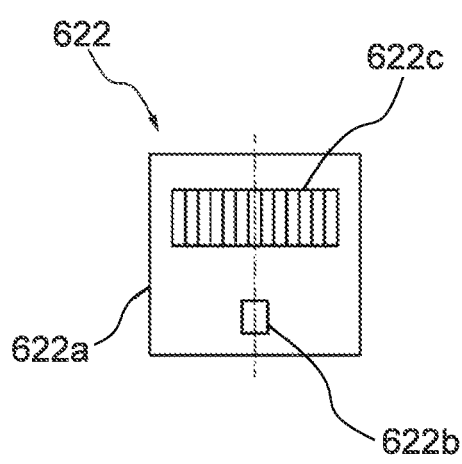
FIGS. 4A to 4C are views useful in explaining the configuration of a pan position detection unit of the image capturing apparatus shown in FIG. 1.
Figure 4B:
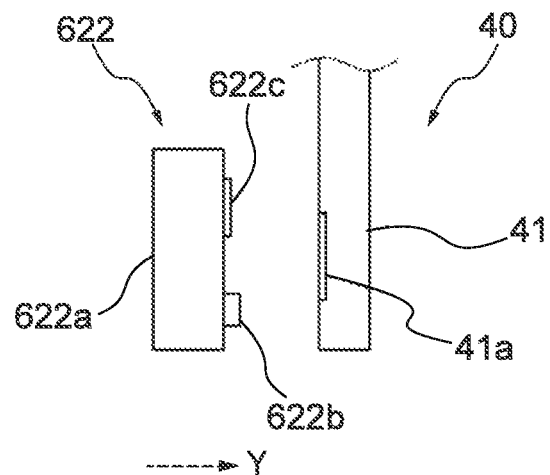
Figure 4C:
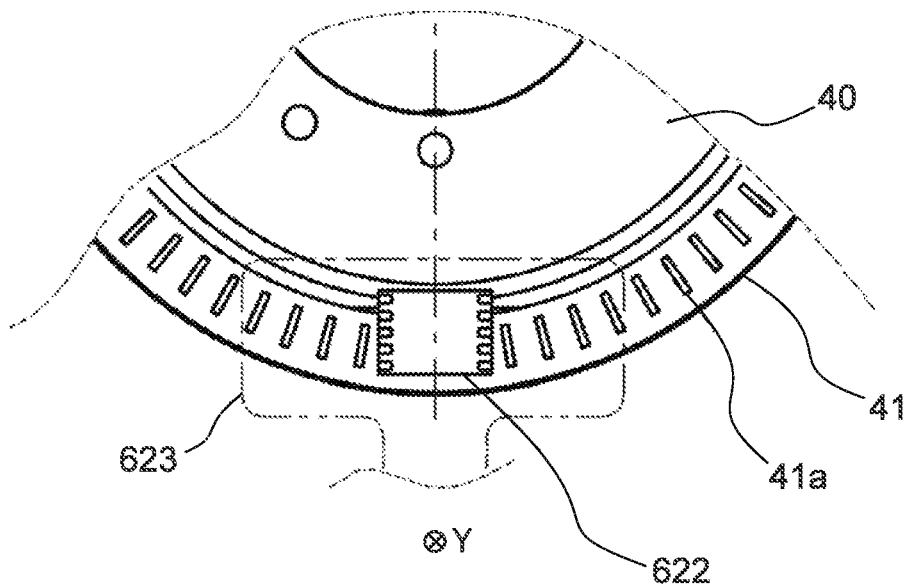

FIGS. 4A to 4C are views useful in explaining the configuration of the pan position detection unit 620. FIG. 4A is a view showing the configuration of an optical sensor 622 as a component of the pan position detection unit 620. FIG. 4B is a view showing a positional relationship between a reflective scale 41 provided in the panning unit-rotating plate 40 and the optical sensor 622, as viewed from a side surface of the image capturing apparatus 100, in which the right-left direction is the Y-axis direction (axial direction of the pan rotation axis P). FIG. 4C is a view showing the positional relationship between the reflective scale 41 provided in the panning unit-rotating plate 40 and the optical sensor 622, as viewed from a bottom side of the image capturing apparatus 100 (−Y-axis direction).

As shown in FIG. 3, the pan position detection unit 620 includes a spacer 621, the optical sensor 622, and a flexible circuit board 623 (one of the fourth wiring members). The optical sensor 622 is mounted on the flexible circuit board 623. The spacer 621 and the flexible circuit board 623 are fixed to the base chassis 601 with screws 624. The optical sensor 622 is arranged such that part of the optical sensor 622 enters the second opening 603. The flexible circuit board 623 is fixed such that the optical sensor 622 and the panning unit-rotating plate 40 are opposed to each other with a predetermined distance therebetween.

The flexible circuit board 623 is connected to the circuit board assembly 70 via wiring disposed inside the image capturing apparatus 100, and a result of detection by the optical sensor 622 is output to the circuit board assembly 70 via the flexible circuit board 623. The panning unit-rotating plate 40 has two concentric areas having the pan rotation axis P as the center. One of the two areas is a sliding area which is in pressure contact with the vibration plate 611 of the pan driving unit 610, and the other area is a position detection area opposed to the optical sensor 622. In the position detection area, the reflective scale 41 formed of a resin material, such as acryl (PMMA) or polycarbonate (PC) is disposed, and on the surface of the reflective scale 41, an optical grating 41a made of e.g. an aluminum film is formed as a reflective film.

Note that the base material of the reflective scale 41 is not limited to the above-mentioned material, but can be selected according to a use or a purpose, and for example, a material, such as quartz glass, blue sheet glass, or silicon wafer, may be used. Further, for the reflective film, not only the aluminum film, but also a chromium film may be employed.

The optical sensor 622 has a structure in which a light emission section 622b that irradiates the reflective scale 41 with light and a light reception array 622c that receives light reflected from the reflective scale 41 are mounted on a substrate 622a and are integrally packaged. For example, a light emission diode is employed for the light emission section 622b and a photo transistor is employed for the light reception array 622c, but these are not limitative.

The light emission section 622b irradiates the optical grating 41a formed on the reflective scale 41 such that reflective portions of the optical grating 41a are arranged at a fixed interval, with light, and the light reception array 622c receives light reflected from the optical grating 41a and outputs an electrical signal after photoelectric conversion. At this time, the light reflected from the optical grating 41*a* forms an image of a reflection pattern (reflectance distribution image), and the light reception array 622*c* outputs a sinusoidal electrical signal according to light amount distribution of this reflectance distribution image.

When the panning unit-rotating plate 40 is rotated and the reflective scale 41 and the optical sensor 622 are moved relative to each other, the reflectance distribution image formed by the light reflected from the optical grating 41*a* on the light reception array 622*c* changes. By reading a sinusoidal electrical signal associated with this change, it is possible to detect a rotational amount (rotational angle) of the panning unit-rotating plate 40, i.e. a rotational amount of the panning operation of the movable section 2. Further, by reading a changing direction of the light that is reflected from the optical grating 41*a* and enters the light reception array 622*c*, it is possible to detect a rotational direction of the panning unit-rotating plate 40, i.e. a rotational direction of the panning operation of the movable section 2.

Figure 5A:
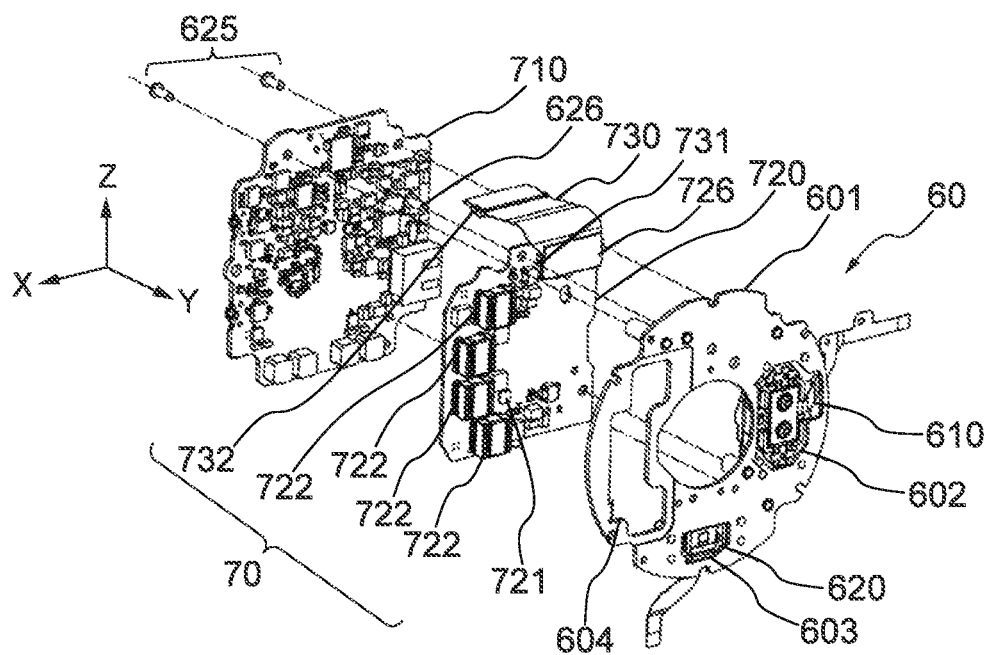
FIGS. 5A and 5B are exploded perspective views useful in explaining a positional relationship between the chassis unit and a circuit board assembly in the image capturing apparatus shown in FIG. 1.
Figure 5B:
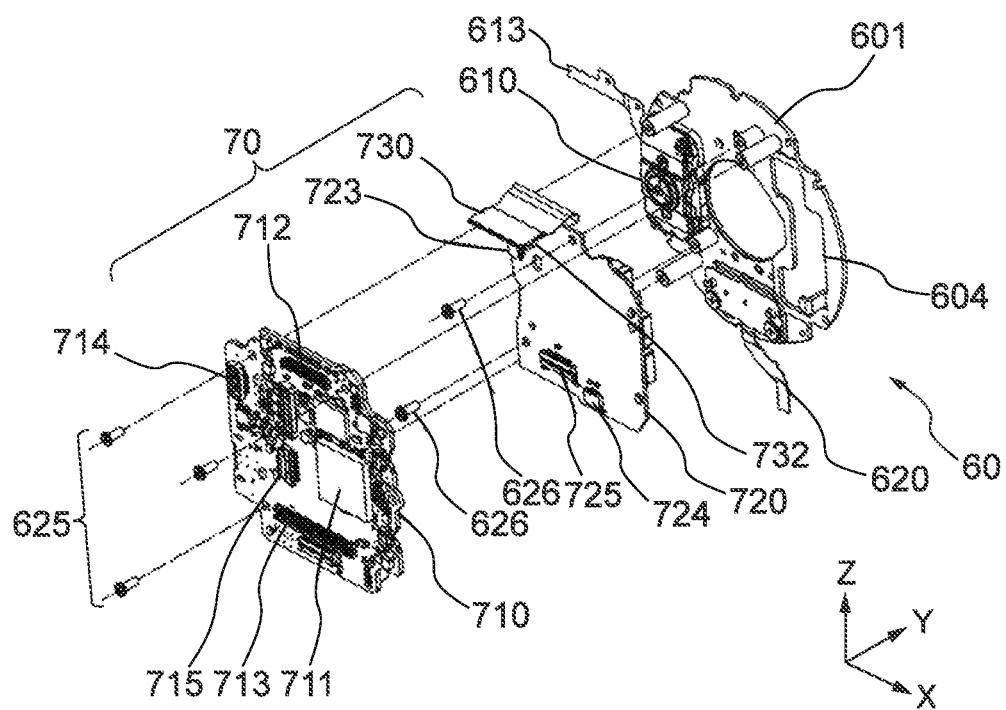

Next, the configuration of the circuit board assembly 70 will be described. FIGS. 5A and 5B are exploded perspective views useful in explaining a positional relationship between the chassis unit 60 and the circuit board assembly 70, in which FIG. 5A is a view as viewed from the chassis unit 60, and FIG. 5B is a view as viewed from the circuit board assembly 70.

The circuit board assembly 70 includes a main control circuit board 710 (first circuit board), a sub control circuit board 720 (second circuit board), and a flexible circuit board 730 (first wiring member). The main control circuit board 710 and the sub control circuit board 720 are arranged close to the chassis unit 60 such that the main control circuit board 710 and the sub control circuit board 720 overlap each other in the Y-axis direction, and the sub control circuit board 720 is disposed between the main control circuit board 710 and the chassis unit 60. The flexible circuit board 730 is a relay circuit board for electrically connecting between the main control circuit board 710 and the sub control circuit board 720, and has a long length and a substantially rectangular shape. A connector 731 is mounted on one end of the flexible circuit board 730 in the longitudinal direction and a connector 732 is mounted on the other end. Note that the connectors 731 and 732 each are a board-to-board type connector.

The main control circuit board 710 has a board-to-board type connector 712 mounted thereon, and the sub control circuit board 720 has a board-to-board type connector 726 mounted thereon. The two connectors 732 and 731 mounted on the flexible circuit board 730 are configured to be connectable to the connectors 712 and 726 in a pair relationship of header and receptacle, respectively.

As mentioned above, the plurality of metal posts are bonded and fixed to the base chassis 601. The metal posts have two types of posts which are different in length. The sub control circuit board 720 is brought into contact with metal posts which are shorter in length and fixed to the chassis unit 60 with a plurality of screws 626. On the other hand, the main control circuit board 710 is brought into contact with metal posts which are longer in length and fixed to the chassis unit 60 with a plurality of screws 625.

First, the flexible circuit board 730 is fixed to the chassis unit 60 together with the sub control circuit board 720 in a state in which the connector 731 and the connector 726 are connected to each other and one end of the flexible circuit board 730 is held by the sub control circuit board 720. Next, the main control circuit board 710 is fixed to the chassis unit 60, and then the connector 732 and the connector 712 are connected. With this, the main control circuit board 710 and the sub control circuit board 720 are electrically connected via the flexible circuit board 730.

The base chassis 601 is formed with the third opening 604. When the sub control circuit board 720 is assembled to the base chassis 601, a plurality of boosting transformers 722 as one of tall electronic components mounted on the sub control circuit board 720 are arranged such that at least part of the boosting transformers 722 is close to a wall surface of the third opening 604. The plurality of boosting transformers 722 are one of the components associated with actuator control.

Note that the tall electronic component refers to a component, which is relatively large in erection height (dimension of protrusion from the mounting surface in a direction perpendicular to the mounting surface), of the various electronic components mounted on the sub control circuit board 720. In the present embodiment, the boosting transformer 722 is a component, which is the highest in erection height, of the electronic components mounted on the sub control circuit board 720. Further, the state in which at least part of the plurality of boosting transformers 722 is close to the wall surface of the third opening 604 includes a state in which at least part of the plurality of boosting transformers 722 has entered the third opening 604 and a state in which no part of the same has entered the third opening 604.

The sub control circuit board 720 has not only the various circuit components, but also FPC connector type connectors 723, 724, and 72, mounted thereon. The flexible circuit board 613 of the pan driving unit 610 is connected to the connector 723. The flexible circuit board 623 of the pan position detection unit 620 is connected to the connector 724. The flexible circuit board 31 of the panning unit-mounting base 30 is connected to the connector 725. The sub control circuit board 720 has not only these, but also an actuator driver IC 721 that controls drive signals of the pan driving unit 610 and the tilt driving unit 32, and various chip electronic components, such as a chip resistor and a ceramic capacitor, mounted thereon.

The main control circuit board 710 has various circuit components mounted thereon, for example, a circuit block including a main control IC 711 that performs control of the overall system of the image capturing apparatus 100, such as image capturing control, image capturing signal processing, electric power conversion, and lens barrel control. The flexible circuit board 730 is provided with signal lines for communicating between the main control IC 711 mounted on the main control circuit board 710 and the actuator driver IC 721 mounted on the sub control circuit board 720. Further, the main control circuit board 710 has connectors 713 and 714, and various electronic components, such as a memory, a chip resistor, a ceramic capacitor, an inductor, and a diode, mounted thereon.

One end of the bundled wire 22 drawn out from the lens barrel unit 21 is connected to the connector 713, and with this, the main control circuit board 710 and the image capturing device in the lens barrel unit 21 are electrically connected to each other. The connector 714 is connected to a board-to-board connector mounted on the flexible circuit board 86, and with this, the battery 90 and the main control circuit board 710 are electrically connected to each other.

In the main control circuit board 710, a power supply supplied from the battery 90 is divided into power supplies of a plurality of channels which are different in voltage, and some of those are supplied to the sub control circuit board 720 via the flexible circuit board 730. In the sub control circuit board 720, a power supply supplied from the main control circuit board 710 is consumed by the actuator driver IC 721 and the boosting transformers 722, and also consumed as power supply for driving the tilt driving unit 32 and the pan driving unit 610.

As described above, the image capturing apparatus 100 employs the configuration in which the sub control circuit board 720 and the main control circuit board 710 are arranged such that the sub control circuit board 720 and the main control circuit board 710 are layered in the mentioned order with respect to the base chassis 601 and are fixed to the metal posts. By dividing the control circuit board into a plurality of circuit boards and arranging these in the layered form, it is possible to reduce a projected installation area of the image capturing apparatus 100 (area in a projection view in the Y-axis direction (area of the image capturing apparatus 100, as viewed from a direction perpendicular to the installation surface)). As a result, it is possible to increase selectivity (increase the choices) of the installation place and thereby improve the usability.

Here, the sub control circuit board 720 is required to be formed into e.g. a cutout shape in order to avoid the metal posts for fixing the main control circuit board 710, and hence, the outer shape of the sub control circuit board 720 is often more restricted that that of the main control circuit board 710. Further, to improve the function of the image capturing apparatus 100 while maintaining the outline size of the circuit boards arranged within the image capturing apparatus 100, for example, an increase in integration of the various IC chips mounted on the main control circuit board 710 is required.

When the increase in integration of the IC chips progresses, in general, electrical connection portions on the main control circuit board 710 are required to be miniaturized. For example, to form a circuit by mounting highly integrated ICs, mounting lands on the main control circuit board 710 require more finely miniaturized and higher-density mounting lands and wiring lead pattern. Further, to arrange signal lines from a lot of electrical connection portions to the circuit blocks of the main control circuit board 710, the main control circuit board 710 tends to be increased in the number of conductor layers.

For this reason, it is desirable that the main control circuit board 710 has a configuration in which the outer shape is less restricted and a degree of freedom in signal wiring is large. By taking such circumstances into consideration, in the image capturing apparatus 100, as the main control circuit board 710, a circuit board which is higher/larger in at least one of the wiring density of the circuit pattern and the number of layers of the circuit patterns than the sub control circuit board 720 is used. Further, by arranging the sub control circuit board 720 and the main control circuit board 710 with respect to the base chassis 601 such that the sub control circuit board 720 and the main control circuit board 710 are layered in the mentioned order, it is possible to realize high functionality while maintaining the projected installation area of the image capturing apparatus 100 as a small area.

Figure 6:
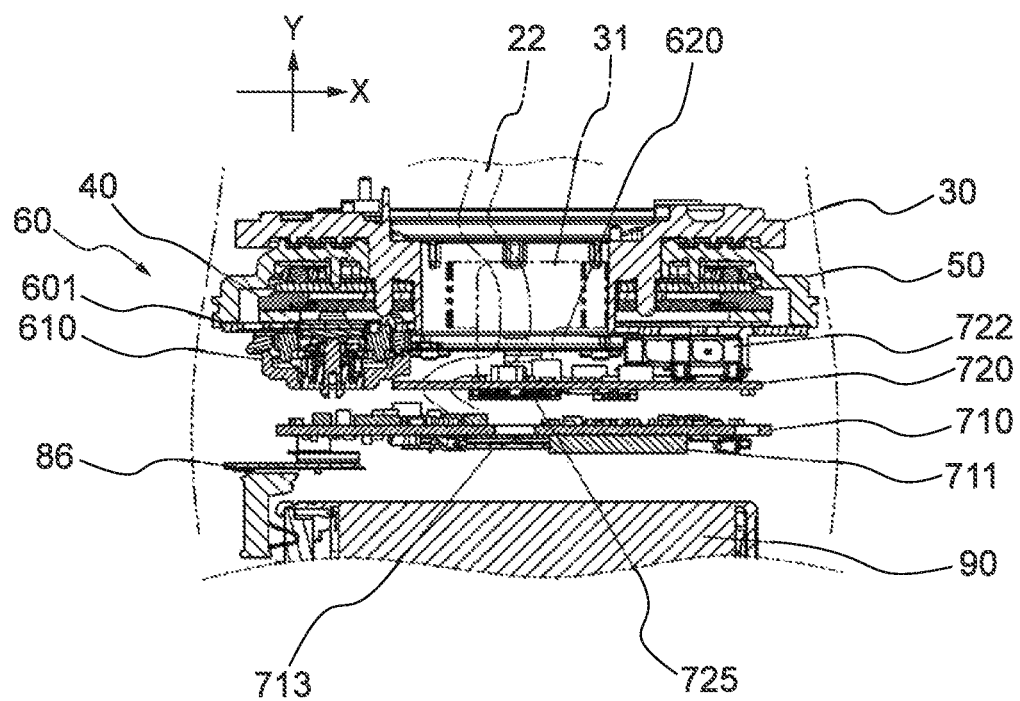
FIG. 6 is a cross-sectional view showing a positional relationship between a sub control circuit board, a pan driving unit, and the pan position detection unit in the image capturing apparatus shown in FIG. 1.

Next, a positional relationship between the pan driving unit 610 and the pan position detection unit 620, and the boosting transformers 722, in the chassis unit 60 on which the sub control circuit board 720 is mounted, will be described. FIG. 6 is a cross-sectional view showing a positional relationship between the sub control circuit board 720, the pan driving unit 610, and the pan position detection unit 620.

As described above, the central part of the base chassis 601 is formed with the substantially circular opening, and the first opening 602, the second opening 603, and the third opening 604 are formed around this opening. The pan driving unit 610 is assembled in the first opening 602, and the pan position detection unit 620 is assembled in the second opening 603. Further, the plurality of boosting transformers 722 mounted on the sub control circuit board 720 are arranged close to the inside of the third opening 604. Thus, the image capturing apparatus 100 has a structure in which in a projection view in the Y-axis direction (projection on an XZ plane orthogonal to the pan rotation axis P), the respective arrangement areas of the pan driving unit 610, the pan position detection unit 620, and the boosting transformers 722, do not overlap one other.

Further, in the image capturing apparatus 100, the boosting transformers 722, the pan driving unit 610, and the pan position detection unit 620 are arranged such that the boosting transformers 722, the pan driving unit 610, and the pan position detection unit 620 at least partially overlap each other in the height direction (Y-axis direction) of the image capturing apparatus 100. In other words, in a projection view in a direction orthogonal to the Y-axis direction, the boosting transformers 722 and the pan driving unit 610 at least partially overlap each other. Similarly, in a projection view in the direction orthogonal to the Y-axis direction, the boosting transformers 722 and the pan position detection unit 620 also at least partially overlap each other.

Further, as described above, the vibration actuator is used for the pan driving unit 610 that drives the movable section 2 in the image capturing apparatus 100. The specifications of the vibration actuator are determined by taking into consideration the conditions of the weight of the movable section 2, the speed of driving the movable section 2, the stopping accuracy, and so forth. At this time, characteristics required of the boosting transformers 722 are determined according to the specifications (driving characteristics) of the vibration actuator. Here, in general, in a case where a vibration actuator having a large output is employed, a large-capacity type is selected as the boosting transformer 722, and the boosting transformer 722 tends to be larger in outer shape (size) as the capacity is lager.

As shown in FIGS. 5A, 5B and 6, in the chassis unit 60, areas where the pan driving unit 610 and the pan position detection unit 620 are mounted are largely different in component occupation range (space occupied by the components) in the Y-axis direction, from a non-mounting area. That is, in the non-mounted area where neither the pan driving unit 610 nor the pan position detection unit 620 is mounted, a certain free space is formed in the Y-axis direction. Accordingly, the sub control circuit board 720 is assembled to the base chassis 601 in a state having the boosting transformers 722 mounted thereon such that the boosting transformers 722 enter this free space formed between the chassis unit 60 and the sub control circuit board 720. Thus, in the image capturing apparatus 100, reduction of the height dimension of the image capturing apparatus 100 is realized by arranging the components while making effective use of the space around the pan rotation axis P.

Further, as described above, the connector 731 disposed on the one end of the flexible circuit board 730 is connected to the connector 726 mounted on the mounting surface of the sub control circuit board 720, on a side toward the base chassis 601, whereby the sub control circuit board 720 and the flexible circuit board 730 are electrically connected to each other. The board-to-board connectors, such as the connectors 726 and 731, can be connected in a single operation, and further, has a feature that the connectors can be made compact by arranging multipolar electrical signals at a narrow pitch, and therefore, the board-to-board connectors are used for various kinds of electronic devices.

The image capturing apparatus 100 is configured such that the header connector, the receptacle connector, and the flexible circuit board 730 are stacked on the mounting surface of the sub control circuit board 720 in the Y-axis direction (direction of the thickness of the board). Therefore, it is necessary to ensure a space for accommodating these components without increasing the height dimension of the image capturing apparatus 100. To this end, the connector 726 is mounted at a location on an XZ plane (as viewed from the Y-axis direction), which overlaps none of the area where the pan driving unit 610 is disposed, the area where the pan position detection unit 620 is disposed, and the area where the boosting transformers 722 are disposed. Then, the connectors 726 and 731, and the flexible circuit board 730 are assembled to the chassis unit 60 by being mounted on the sub control circuit board 720 such that the connectors 726 and 731, and the flexible circuit board 730 are accommodated in the free space formed between the chassis unit 60 and the sub control circuit board 720.

On the other hand, tall electronic components, such as the boosting transformer 722 and the board-to-board connector, are not mounted on the mounting surface of the sub control circuit board 720 on a side toward the main control circuit board 710, but only electrical components which are lower in erection height than the tall electronic components are mounted on the same. This reduces restriction of arrangement and wiring of the electrical components on the main control circuit board 710, and increases the degree of freedom in designing. Further, it is possible to arrange the main control circuit board 710 close to the sub control circuit board 720, and hence it is possible to further reduce the height dimension of the image capturing apparatus 100.

As described above, the connector 713 is mounted on the mounting surface of the main control circuit board 710 on a side toward the battery 90 (bottom side of the image capturing apparatus 100). The one end of the bundled wire 22 drawn out from the lens barrel unit 21 is connected to the connector 713. Further, an end of the bundled wire 22 on a side toward the lens barrel unit 21 is displaced relative to the fixed section 1 according to the panning operation and the tilting operation of the lens barrel unit 21. This displacement causes bending or twisting of the wiring material part of the bundled wire 22, and if stress caused by the bending or twisting acts on the connection portion of the connector 713, electrical connection may become unstable. Further, as the part which is bent or twisted is closer to the connection portion of the connector 713, in general, the stress applied to the connector 713 becomes larger. To prevent this, in the image capturing apparatus 100, the main control circuit board 710 is fixed to the base chassis 601 at a location more distant from the movable section 2 than the sub control circuit board 720, whereby the stress generated in the connection portion of the connector 713 is reduced as much as possible to thereby increase the reliability of electrical connection.

Figure 7:
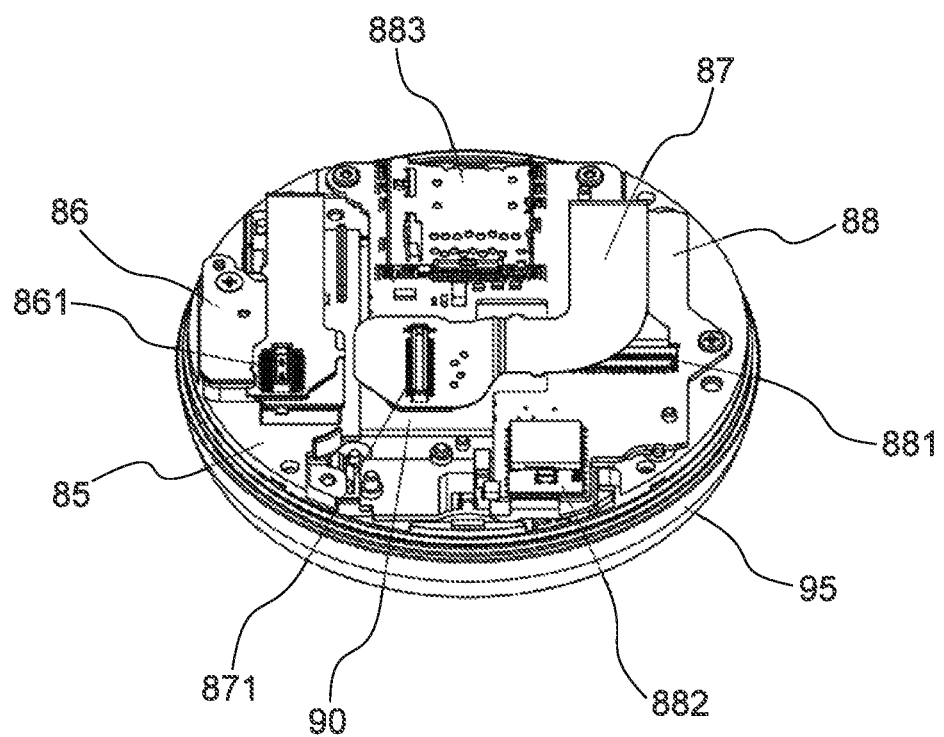
FIG. 7 is a perspective view showing a state in which a battery box and a bottom cover have been assembled in the image capturing apparatus shown in FIG. 1.

Next, the configuration of the battery box 85 will be described. FIG. 7 is a perspective view showing a state in which the battery box 85 and the bottom cover 95 have been assembled to each other. The bottom cover 95 and the battery box 85 are formed such that the bottom cover 95 and the battery box 85 can be assembled as a partial unit including the battery 90, and are fixed to the middle cover 80 after being assembled.

As described above, the flexible circuit board 86 is fixed to the battery box 85, and a battery connector mounted on one end of the flexible circuit board 86 is electrically connected to a terminal portion of the battery 90. Further, a printed circuit board 88 is fixed to the battery box 85 with a plurality of screws, and a connector 881, a wireless module 882, and a memory card connector 883 are mounted on the printed circuit board 88.

The wireless module 882 is, for example, compliant with a near field wireless communication standard, such as Bluetooth (registered trademark), or compliant with a wireless LAN communication system, such as Wi-Fi (registered trademark). The memory card connector 883 accommodates a storage medium (memory card) of various standards, such as an SD card, a micro SD card, and a CF card, and enables communication between a storage medium and the main control circuit board 710. The connector 881 is a connector of an FPC connector type, and one end of a flexible circuit board 87 is connected to the connector 881.

The flexible circuit board 87 is a relay flexible circuit board that electrically connects between the printed circuit board 88 and the main control circuit board 710, and a connector 871 which can be connected to the connector 715 mounted on the main control circuit board 710 is mounted on the other end of the flexible circuit board 87. By using the printed circuit board 88, it is possible to improve functions, such as the function of wireless communication with an external device and the function of storing data in a memory card.

The printed circuit board 88 and the flexible circuit board 87 are accommodated in a free space formed in an area surrounded by the battery 90, the main control circuit board 710, and the flexible circuit board 86. Further, the printed circuit board 88 and the flexible circuit board 87 are arranged such that in a projection view in the Y-axis direction, the printed circuit board 88 and the flexible circuit board 87 do not overlap the flexible circuit board 86. With this, it is possible to maintain the state of the image capturing apparatus 100 reduced in height.

Further, in the image capturing apparatus 100, the printed circuit board 88 is fixed not to the base chassis 601, but to the battery box 85. Assuming the printed circuit board 88 is fixed to the base chassis 601, it is necessary to extend the plurality of metal posts that hold the printed circuit board 88 from the base chassis 601 and form a cutout portion in the main control circuit board 710 so as to avoid those metal posts. In this case, the substrate area of the main control circuit board 710 is reduced, so that there is a possibility that an electric circuit of an intended scale cannot be provided thereon, and the electric circuit which cannot be mounted is required to be provided on the sub control circuit board 720. As a result, as the sub control circuit board 720, a multilayer circuit board having a lot of layers is needed, or it is necessary to form a fine conductor pattern, which increases the manufacturing costs of the sub control circuit board 720. On the other hand, to avoid this problem, if an electronic component which cannot be mounted on the main control circuit board 710 is mounted on another new circuit board, the number of circuit boards is increased, so that the above-described effect of reducing the height dimension of the image capturing apparatus 100 is lost. To prevent this, the printed circuit board 88 is fixed to the battery box 85, whereby it is possible to realize not only reduction of the height dimension of the image capturing apparatus 100, but also reduction of costs.

As described above, in the image capturing apparatus 100, it is possible to reduce the projected installation area and height dimension thereof, and as a result, it is possible to make the whole image capturing apparatus 100 compact in size while maintaining or enhancing the functions thereof.

Note that although in the first embodiment, the boosting transformers 722 are described as an example of the electrical components mounted on the sub control circuit board 720, which are large in component size, the electrical components which are large in component size are not limited to them. For example, in place of the boosting transformers 722, an electronic component, such as a common mode filter for eliminating common mode noise generated in a driving power supply of the actuator, a power inductor assembled in a voltage conversion circuit, or an aluminum electrolytic capacitor, may be mounted. Further, although in the present embodiment, the description is given of the image capturing apparatus as the electronic apparatus according to the present invention, this is not limitative, but the present invention can be widely applied to electronic apparatuses that include a movable section and a fixed section.

Next, a second embodiment of the present invention will be described. As described above, in the image capturing apparatus 100, the plurality of operation sections which can be pushed from the outside are arranged on the side surface of the middle cover 80. Each operation section is formed by a combination of a push-in switch that detects an operation of pushing in a pushed portion provided on the switch, and a push button pushed by an operator for pushing in the pushed portion of the push-in switch. Therefore, unless the push-in switch and the push button are properly positioned, an operation feeling felt when operating the push button is lowered, and an unintended force can be applied to the push-in switch, which may prevent the push-in switch from normally operating.

As a technique that copes with this problem, for example, Japanese Laid-Open Patent Publication (Kokai) No. H07-235777 has proposed a technique in which a display window and a push button are integrally molded, and the display window is positioned in an exterior of an apparatus.

However, in the technique described in Japanese Laid-Open Patent Publication (Kokai) No. H07-235777, a circuit board on which a push-in switch is mounted is not sufficiently positioned with respect to the exterior of the electronic apparatus, and as a result, there is a possibility that the accuracy of positioning the push button and the push-in switch becomes insufficient. Further, when the push-in switch is pushed-in by the push button, there is a possibility that the circuit board on which the push-in switch is mounted is deformed, and if the circuit board is deformed, lowering of the operation feeling or failure of the push-in switch is liable to occur.

To prevent this, in the second embodiment, a description will be given of an image capturing apparatus provided with an operation section that realizes high-accuracy positioning of the push-in switch and the push button and is difficult to have the push-in switch displaced in position when the push button is operated.

Figure 8A:
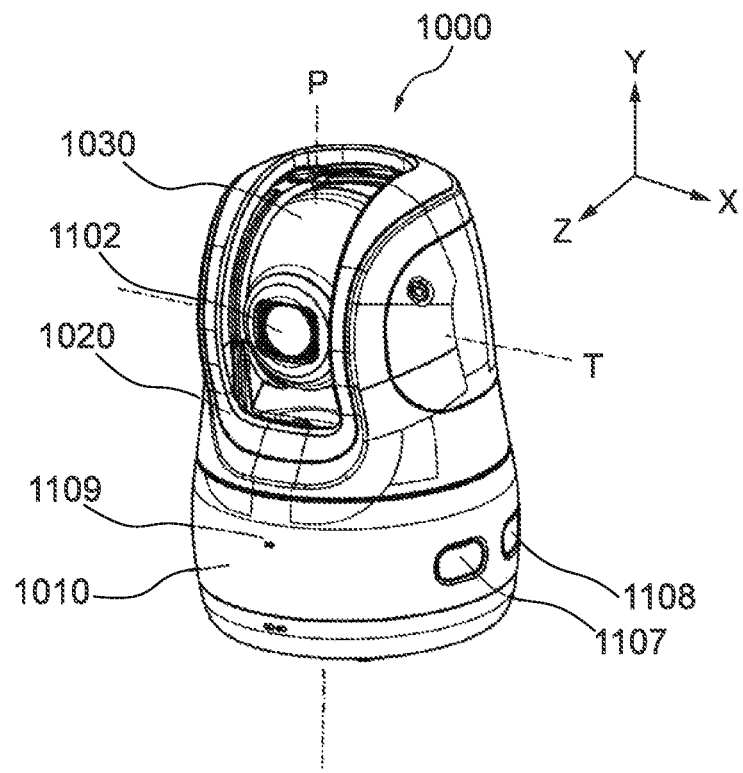
FIGS. 8A and 8B are perspective views of the appearance of an image capturing apparatus an electronic apparatus according to a second embodiment of the present invention.
Figure 8B:
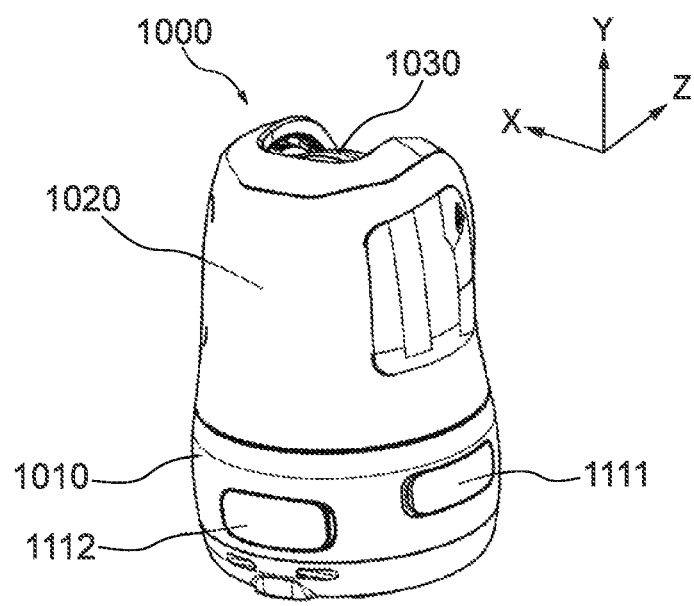
Figure 9:
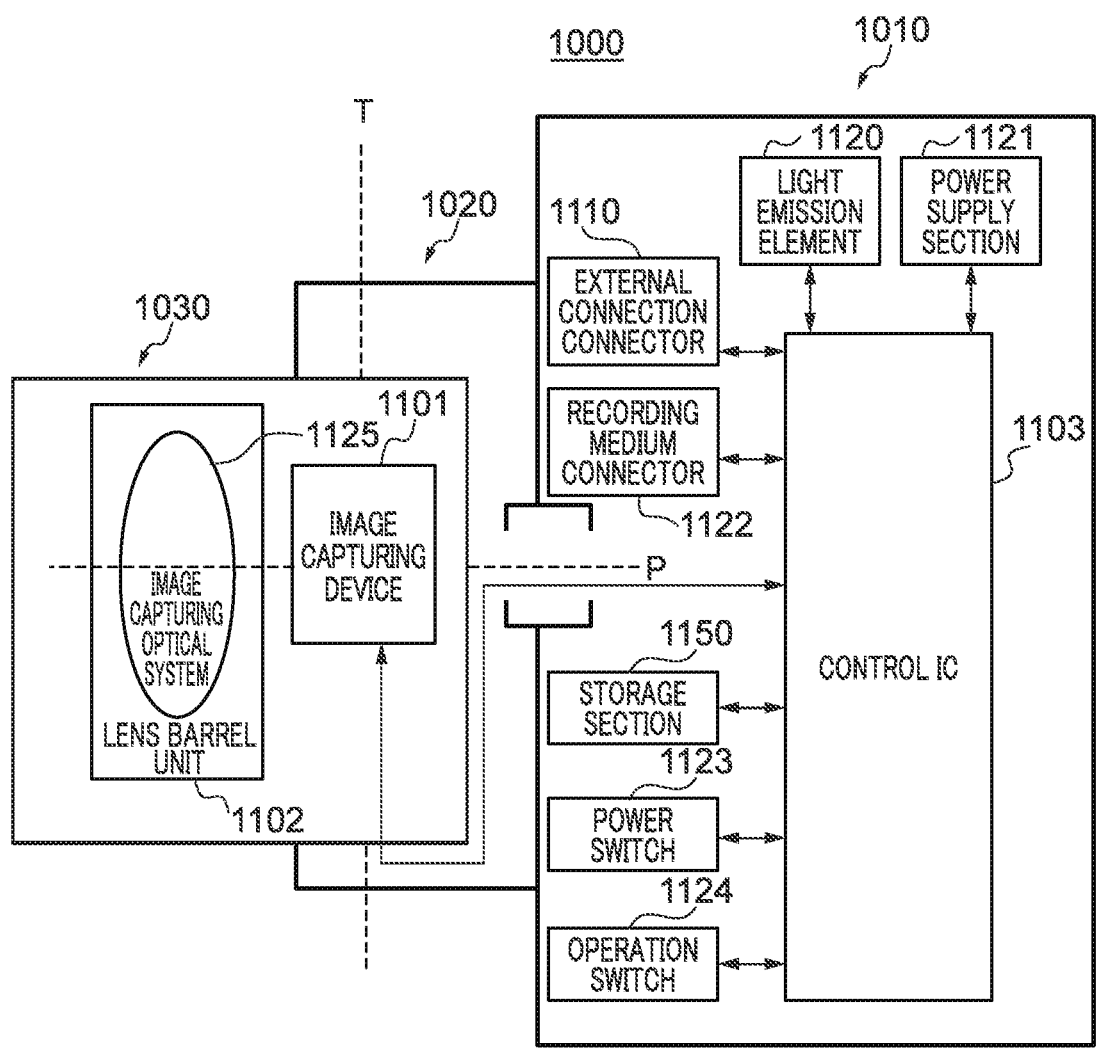
FIG. 9 is a block diagram of the image capturing apparatus shown in FIGS. 8A and 8B.

FIG. 8A is a perspective view of the appearance of an image capturing apparatus 1000 according to the second embodiment, as viewed obliquely from the front. FIG. 8B is a perspective view of the appearance of the image capturing apparatus 1000, as viewed obliquely from the rear. FIG. 9 is a schematic block diagram of the image capturing apparatus 1000.

The appearance of the image capturing apparatus 1000 is substantially the same as that of the image capturing apparatus 100 according to the first embodiment, and therefore, the same coordinate system as the three-dimensional orthogonal coordinate system set in FIG. 1 is set with respect to the image capturing apparatus 1000 as shown in FIGS. 8A and 8B for convenience of explanation.

The image capturing apparatus 1000 includes a fixed section 1010, a first movable section 1020, and a second movable section 1030. The first movable section 1020 is mounted on the fixed section 1010 such that the first movable section 1020 is rotatable about a pan rotation axis P (indicated by a one-dot chain line in FIG. 8A) parallel to the Y-axis. The second movable section 1030 is held by the first movable section 1020 such that the second movable section 1030 is rotatable about a tilt rotation axis T (indicated by a one-dot chain line in FIG. 8A) orthogonal to the Y-axis. Thus, the image capturing apparatus 1000 is configured such that the second movable section 1030 can be rotated with respect to the fixed section 1010 with degrees of freedom of the axes of the pan rotation axis P and the tilt rotation axis T.

The second movable section 1030 includes an image capturing device 1101 and a lens barrel unit 1102, and the lens barrel unit 1102 includes an image capturing optical system 1125. The image capturing device 1101 is e.g. a CCD image sensor or CMOS image sensor that photoelectrically converts an optical image to generate image signals. The image capturing optical system 1125 is formed by various lenses for causing an object image to be formed on the image capturing device 1101, a diaphragm, and so forth, and the lens barrel unit 1102 holds the various components forming the image capturing optical system 1125. An optical axis direction (i.e. image capturing direction) of the image capturing optical system 1125 can be changed by rotation of the first movable section 1020 about the pan rotation axis P and rotation of the second movable section 1030 about the tilt rotation axis T.

As shown in FIGS. 8A and 8B, the fixed section 1010 is provided with a power button 1107, an operation button 1108, a display window 1109, an external connection connector cover 1111, and a recording medium connector cover 1112. Further, as shown in FIG. 9, the fixed section 1010 includes a control IC 1103, an external connection connector 1110, a light emission element 1120, a power supply section 1121, a recording medium connector 1122, a power switch 1123, an operation switch 1124, and a storage section 1150.

The control IC 1103 controls the overall operation of the image capturing apparatus 1000, including operations related to the function of processing image signals generated by the image capturing device 1101 to generate image data. Note that the storage section 1150 includes storage devices, such as a ROM storing programs for predetermined operations and processing executed by the control IC 1103 and a RAM for loading programs, and a storage device, such as a memory card, for storing image data generated by the control IC 1103. The power supply section 1121 supplies necessary electric power (power supply) to the control IC 1103, the image capturing device 1101, and so forth.

When the power button 1107 of a push-button switch type, which is provided on a right side (+X side) of the fixed section 1010, is pushed in, this operation is detected by the power switch 1123. The control IC 1103 switches between a power-off state and a power-on state of the image capturing apparatus 1000 according to a result of the detection by the power switch 1123. Further, when the operation button 1108 of a push-button switch type, which is provided on the right side of the fixed section 1010, is pushed in in a case where the image capturing apparatus 1000 is in the power-on state, this operation is detected by the operation switch 1124. The control IC 1103 switches the operating state of the image capturing apparatus 1000 according to a result of the detection by the operation switch 1124.

The display window 1109 is a transparent or translucent member and is provided on a front side of the fixed section 1010. The light emission element 1120 is e.g. an LED and is disposed inside the image capturing apparatus 1000 at a location opposed to the display window 1109. A user can visually confirm a light emission state of the light emission element 1120 through the display window 1109 from the outside of the image capturing apparatus 1000. For example, the control IC 1103 causes the light emission element 1120 to emit light during moving image recording performed by the image capturing apparatus 1000. With this, the user can recognize that the image capturing apparatus 1000 is performing a moving image recording operation by confirming light emission from the light emission element 1120 through the display window 1109. Note that although in the present embodiment, the display window 1109 is disposed on the front side of the fixed section 1010, by taking the visibility from a user into consideration, the display window 1109 may be disposed at another location, by considering an installation location and a use form of the image capturing apparatus 1000.

The external connection connector cover 1111 is provided on a left side (−X side) of the fixed section 1010 and is configured to be movable between a position for covering the external connection connector 1110 when the external connection connector 1110 is not used and a position for exposing the same to the outside when it is used. The recording medium connector cover 1112 is provided on a rear side of the fixed section 1010 and is configured to be movable between a position for covering the recording medium connector 1122 when the recording medium connector 1122 is not used and a position for exposing the same to the outside when it is used.

Figure 10A:
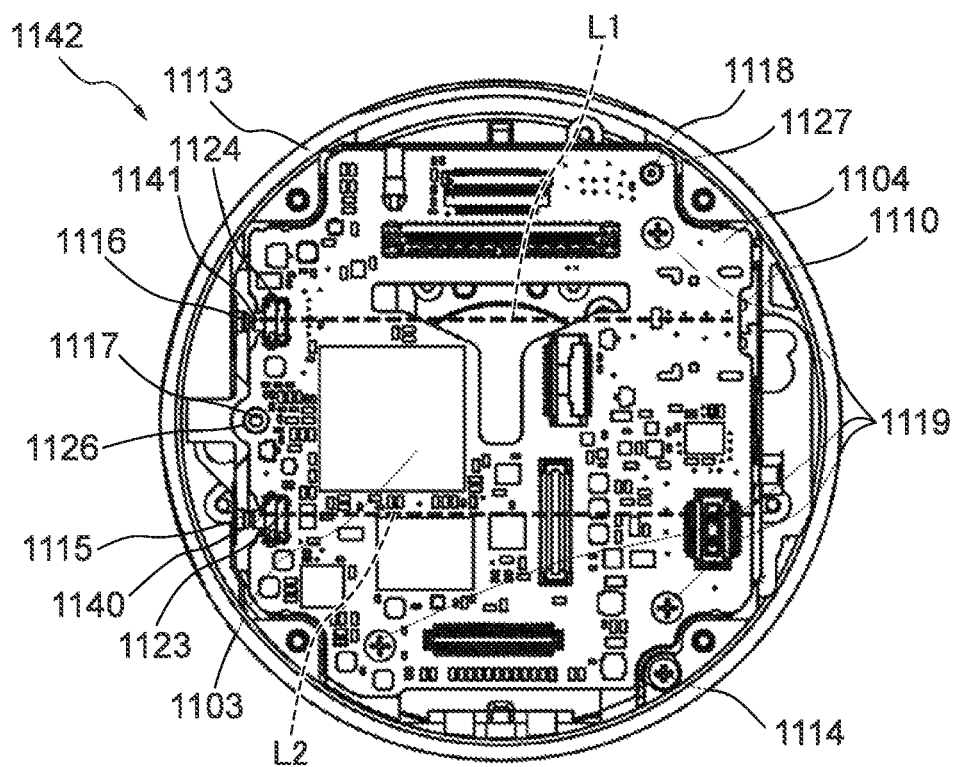
FIGS. 10A and 10B are views showing the configuration of an upper fixed unit of the image capturing apparatus shown in FIGS. 8A and 8B.
Figure 10B:
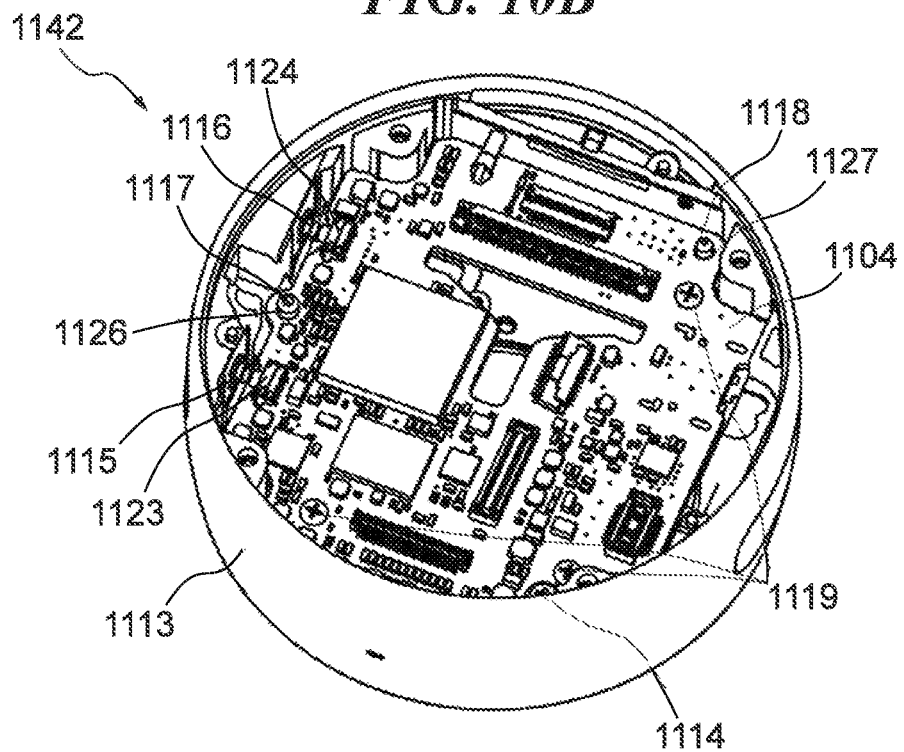
Figure 11:
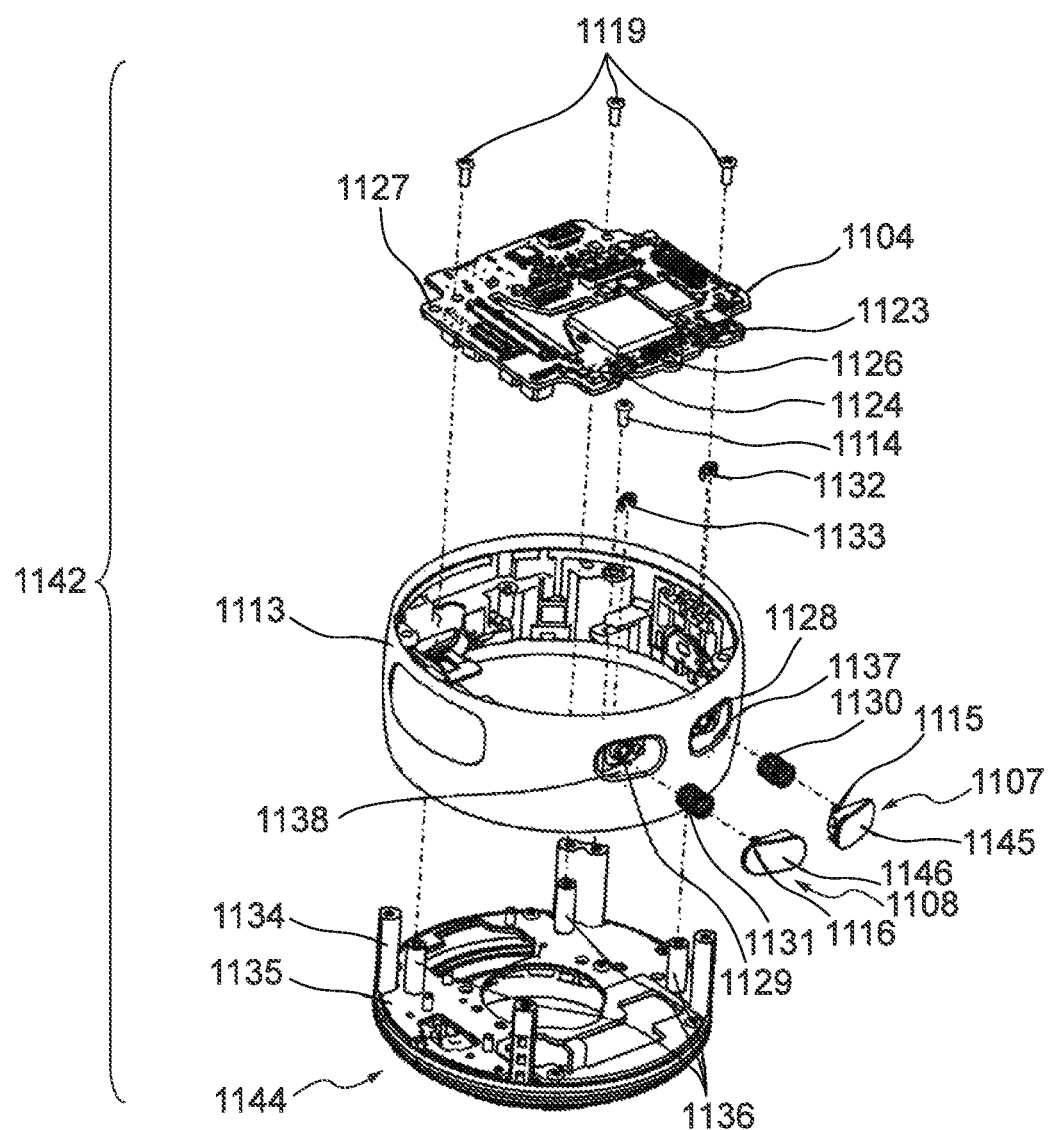
FIG. 11 is an exploded perspective view of the upper fixed unit shown in FIGS. 10A and 10B.
Figure 12:
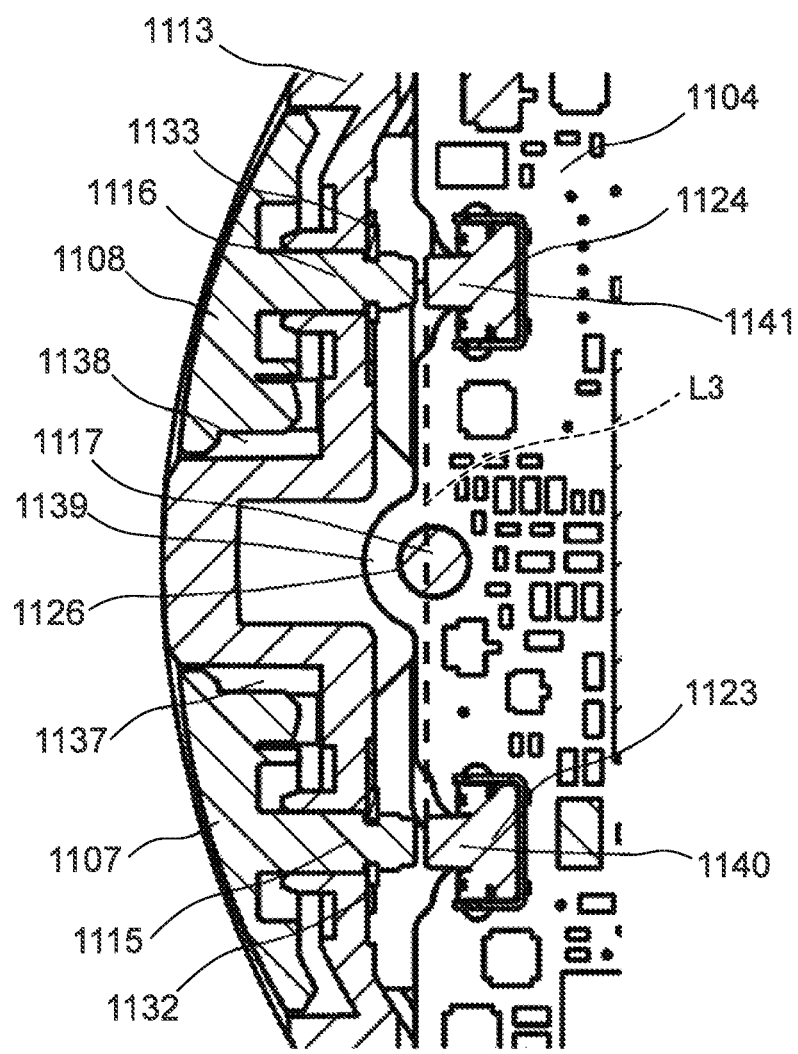
FIG. 12 is an enlarged cross-sectional view of essential parts of the upper fixed unit shown in FIGS. 10A and 10B.

Next, the configuration of the fixed section 1010 will be described in detail. The fixed section 1010 is formed by an upper fixed unit and a lower fixed unit. FIG. 10A is a top view of the upper fixed unit, denoted by reference numeral 1142. FIG. 10B is a perspective view of the appearance of the upper fixed unit 1142. FIG. 11 is an exploded perspective view of the upper fixed unit 1142. FIG. 12 is a cross-sectional view showing essential parts of the upper fixed unit 1142 on an enlarged scale. Note that the lower fixed unit has no characteristic features of the present embodiment, and hence description thereof is omitted.

The upper fixed unit 1142 includes a main control circuit board 1104, a base unit 1144, and an exterior member 1113. The exterior of the upper fixed unit 1142 is formed by the exterior member 1113. The main control circuit board 1104 has various processing circuits mounted thereon, including the control IC 1103, and is arranged inside the exterior member 1113.

The base unit 1144 includes a base sheet metal 1135, main control circuit board posts 1136, and base resin moldings 1134. The base sheet metal 1135 is a metal structural member. The main control circuit board posts 1136 are metal posts mounted on the base sheet metal 1135 by screwing, and each has a female screw formed in an end portion opposite from an end portion screwed to the base sheet metal 1135. The base resin moldings 1134 are a structural member formed by resin molding. The base unit 1144 is assembled by fastening the base sheet metal 1135 to the base resin moldings 1134 with a plurality of screws.

The power button 1107 includes a power button operation portion 1145 operated by a user and a substantially cylindrical power button pushing portion 1115 which protrudes from the power button operation portion 1145. The power switch 1123 is mounted on the main control circuit board 1104 and has a power switch pushed portion 1140 that detects, when pushed in a right direction, as viewed in FIG. 10A, an operation performed on the power switch 1123. When the power button 1107 is pushed in, the power switch pushed portion 1140 of the power switch 1123 is pushed in by the tip end of the power button pushing portion 1115 in the right direction, as viewed in FIG. 10A, whereupon the control IC 1103 detects the user's push-in operation of the power button 1107.

The operation button 1108 includes an operation button operation portion 1146 operated by a user and a substantially cylindrical operation button pushing portion 1116 which protrudes from the operation button operation portion 1146. The operation switch 1124 is mounted on the same surface of the main control circuit board 1104, on which the power switch 1123 is mounted, and has an operation switch pushed portion 1141 that detects, when pushed in the right direction, as viewed in FIG. 10A, an operation performed on the operation switch 1124. When the operation button 1108 is pushed in, the operation switch pushed portion 1141 of the operation switch 1124 is pushed in by the tip end of the operation button pushing portion 1116 in the right direction, as viewed in FIG. 10A, whereupon the control IC 1103 detects the user's push-in operation of the operation button 1108.

Note that the exterior member 1113 is formed with a power button hole 1128 for inserting the power button pushing portion 1115 and an operation button hole 1129 for inserting the operation button pushing portion 1116.

Next, assembly of the power button 1107 and the operation button 1108 to the exterior member 1113 will be described.

To assemble the power button 1107, first, the power button pushing portion 1115 is inserted through a power button spring 1130 which is a coil spring. Next, the power button pushing portion 1115 is inserted through the power button hole 1128 in a state in which the power button spring 1130 is sandwiched between the power button operation portion 1145 and the exterior member 1113. Then, the power button operation portion 1145 is accommodated in a power button-accommodating space 1137 which is an accommodating portion formed in the exterior member 1113. In this state, a power button E ring 1132 is mounted to a portion, which protrudes inside the exterior member 1113, of the power button pushing portion 1115. Thus, assembly of the power button 1107 to the exterior member 1113 is completed.

On the other hand, to assemble the operation button 1108, first, the operation button pushing portion 1116 is inserted through an operation button spring 1131 which is a coil spring. Next, the operation button pushing portion 1116 is inserted through the operation button hole 1129 in a state in which the operation button spring 1131 is sandwiched between the operation button operation portion 1146 and the exterior member 1113. Then, the operation button operation portion 1146 is accommodated in an operation button-accommodating space 1138 which is an accommodating portion formed in the exterior member 1113. In this state, an operation button E ring 1133 is mounted to a portion, which protrudes inside the exterior member 1113, of the operation button pushing portion 1116. With this, assembly of the operation button 1108 to the exterior member 1113 is completed.

Note that the power button spring 1130 is a component that urges the power button 1107 toward the outside of the exterior member 1113 (left side, as viewed in FIG. 10A). Due to the action of the power button spring 1130, in a case where the power button 1107 is not pushed, the tip end of the power button pushing portion 1115 is spaced from the power switch pushed portion 1140 by a fixed distance. Further, the operation button spring 1131 is a component that urges the operation button 1108 toward the outside of the exterior member 1113 (left side, as viewed in FIG. 10A). Due to the action of the operation button spring 1131, in a case where the operation button 1108 is not pushed, the tip end of the operation button pushing portion 1116 is spaced from the operation switch pushed portion 1141 by a fixed distance.

As shown in FIG. 11, the main control circuit board 1104 is fastened to the female screws formed in the main control circuit board posts 1136 with three main control circuit board-fixing screws 1119, and the exterior member 1113 is fastened to the base resin moldings 1134 with exterior member-fixing screws 1114. The main control circuit board 1104 and the exterior member 1113 are thus fixed to the base unit 1144, whereby the positional relationship between the power switch 1123 and the power button 1107 is determined, and also, the positional relationship between the operation switch 1124 and the operation button 1108 is determined.

Next, positioning between the power button 1107 and the power switch 1123 and positioning between the operation button 1108 and the operation switch 1124 will be described. The main control circuit board 1104 is formed with two through holes, i.e. a positioning hole 1126 and a rotation stopper hole 1127. The exterior member 1113 is provided with two cylindrical portions, i.e. a positioning column 1117 (first columnar portion) and a rotation stopper column 1118 (second columnar portion).

The process for fastening the main control circuit board 1104 to the female screws formed in the main control circuit board posts 1136 with the main control circuit board-fixing screws 1119 is performed in a state in which the positioning column 1117 has been inserted through the positioning hole 1126 and the rotation stopper column 1118 has been inserted through the rotation stopper hole 1127. With this, the main control circuit board 1104 is positioned with respect to the exterior member 1113 by the actions of the positioning hole 1126 and the positioning column 1117. Thus, the positioning hole 1126 and the rotation stopper hole 1127 play the role of increasing the accuracy of positioning the main control circuit board 1104 with respect to the exterior member 1113.

Here, assuming that the main control circuit board 1104 is positioned only by using the positioning hole 1126 and the positioning column 1117, the main control circuit board 1104 is not positioned with respect to the exterior member 1113 in a direction of rotation about the positioning column 1117. Therefore, to position the main control circuit board 1104 with respect to the exterior member 1113 in the direction of rotation about the positioning column 1117, the action of the rotation stopper hole 1127 and the rotation stopper column 1118 is made use of.

The positioning hole 1126 is formed into a substantially perfect circle, and the positioning hole 1126 and the cross-section of the positioning column 1117 have substantially the same shape. On the other hand, the rotation stopper hole 1127 is formed into a long hole shape formed by connecting semi-circular shapes by two line segments parallel to each other, and the two parallel line segments forming the shape of the rotation stopper hole 1127 are parallel to a line connecting between the center of the positioning hole 1126 and the center of the rotation stopper hole 1127. Further, the rotation stopper column 1118 has a shape which is in contact with the two parallel line segments forming the shape of the rotation stopper hole 1127. That is, the center of the rotation stopper column 1118 is positioned on the line connecting between the center of the positioning hole 1126 and the center of the rotation stopper hole 1127, and is spaced from the inner walls of the two semi-circular shapes which are portions of the rotation stopper hole 1127 by a fixed distance.

Thus, the exterior member 1113 is provided with the positioning column 1117 and the rotation stopper column 1118, and the power button 1107 and the operation button 1108 which are mounted on the exterior member 1113 and the power switch 1123 and the operation switch 1124 which are mounted on the main control circuit board 1104 are positioned. This makes it possible to increase the positioning accuracy between the power switch 1123 and the power button 1107 and the positioning accuracy between the operation switch 1124 and the operation button 1108.

To increase the positioning accuracy between the power switch 1123 and the power button 1107, positioning of the tip end of the power switch pushed portion 1140 with respect to exterior member 1113 is important. Similarly, to increase the positioning accuracy between the operation switch 1124 and the operation button 1108, positioning of the tip end of the operation switch pushed portion 1141 with respect to exterior member 1113 is important.

A broken line L3 indicated in FIG. 12 is a line connecting between the tip end of the power switch pushed portion 1140 and the tip end of the operation switch pushed portion 1141. In general, positional variation between components becomes larger as the distance between the components is longer. On the other hand, in the image capturing apparatus 1000, the positioning hole 1126 and the positioning column 1117 are arranged such that at least a portion thereof crosses the broken line L3 between the tip end of the power switch pushed portion 1140 and the tip end of the operation switch pushed portion 1141. That is, the distances between the tip end of the power switch pushed portion 1140 and the tip end of the operation switch pushed portion 1141, and the positioning column 1117 are made short. This makes it possible to further increase the accuracy of positioning of the tip end of the power switch pushed portion 1140 and the tip end of the operation switch pushed portion 1141 with respect to the exterior member 1113.

When an operation of pushing the power button 1107 or the operation button 1108 is performed, a force is applied to the power switch 1123 or the operation switch 1124 in a right direction, as viewed in FIG. 12, and the force acts on the main control circuit board 1104 to deform the main control circuit board 1104. However, the image capturing apparatus 1000 has a structure in which the positioning column 1117 is disposed in the vicinity of the power switch 1123 and the operation switch 1124, and the force for deforming the main control circuit board 1104 is received by the positioning column 1117. Therefore, it is possible to suppress the main control circuit board 1104 from being deformed, and as a result, it is possible to suppress positional displacement of the power switch 1123 caused by the operation of the power button 1107. Similarly, it is also possible to prevent positional displacement of the operation switch 1124 caused by the operation of the operation button 1108.

When a comparison is made between a force received by the positioning column 1117 and a force received by the rotation stopper column 1118 when the power button 1107 and the operation button 1108 are operated, respectively, the positioning column 1117 disposed in the vicinity of the power switch 1123 and the operation switch 1124 receives a larger force. To cope with this, the positioning column 1117 is made thicker (larger in diameter) than the rotation stopper column 1118 so as to make the position of the main control circuit board 1104 difficult to be displaced with respect to the exterior member 1113.

Further, it is desirable to cause the rotation stopper column 1118 to receive part of the force applied to the main control circuit board 1104 to thereby prevent an excessive force from being applied to the positioning column 1117. Here, an extended line of a vector of a force applied when the power button 1107 is operated and an extended line of a vector of a force applied when the operation button 1108 is operated are represented by a broken line L1 and a broken line L2 in FIG. 10A, respectively. The rotation stopper column 1118 is disposed outside an area sandwiched between the broken line L1 and the broken line L2. This is for the following reason: The rotation stopper column 1118 and the operation stopper hole 1127 are spaced from each other by a fixed distance along the line connecting between the center of the positioning hole 1126 and the center of the rotation stopper hole 1127. Therefore, if the rotation stopper column 1118 is disposed in the area sandwiched between the extended line of the direction in which a force is applied when the power button 1107 is pushed and the extended line of the direction in which a force is applied when the operation button 1108 is pushed, the force cannot be received by the rotation stopper column 1118. To prevent occurrence of this problem, the rotation stopper column 1118 is arranged outside the area sandwiched between the broken line L1 and the broken line L2.

As shown in FIG. 12, the main control circuit board 1104 has a main control circuit board protruding portion 1139 that protrudes toward a space between a wall portion, which defines the power button-accommodating space 1137, of the exterior member 1113, and a wall portion, which defines the operation button-accommodating space 1138, of the exterior member 1113. Further, part of the positioning hole 1126 is disposed in the main control circuit board protruding portion 1139. With this, on the main control circuit board 1104, it is possible to secure a larger area for arranging the pattern wiring and the electronic components, and increase the degree of freedom for arranging the pattern wiring and the electronic components.

As described above, in the second embodiment, for the operation section formed by the combination of the push-in switch (power switch 1123, operation switch 1124) and the push button (power button 1107, operation button 1108), it is possible to position the push-in switch and the push button with high accuracy. Further, it is possible to provide the operation section configured such that the position of the push-in switch is difficult to be displaced when the push button is pushed.

Figure 13:
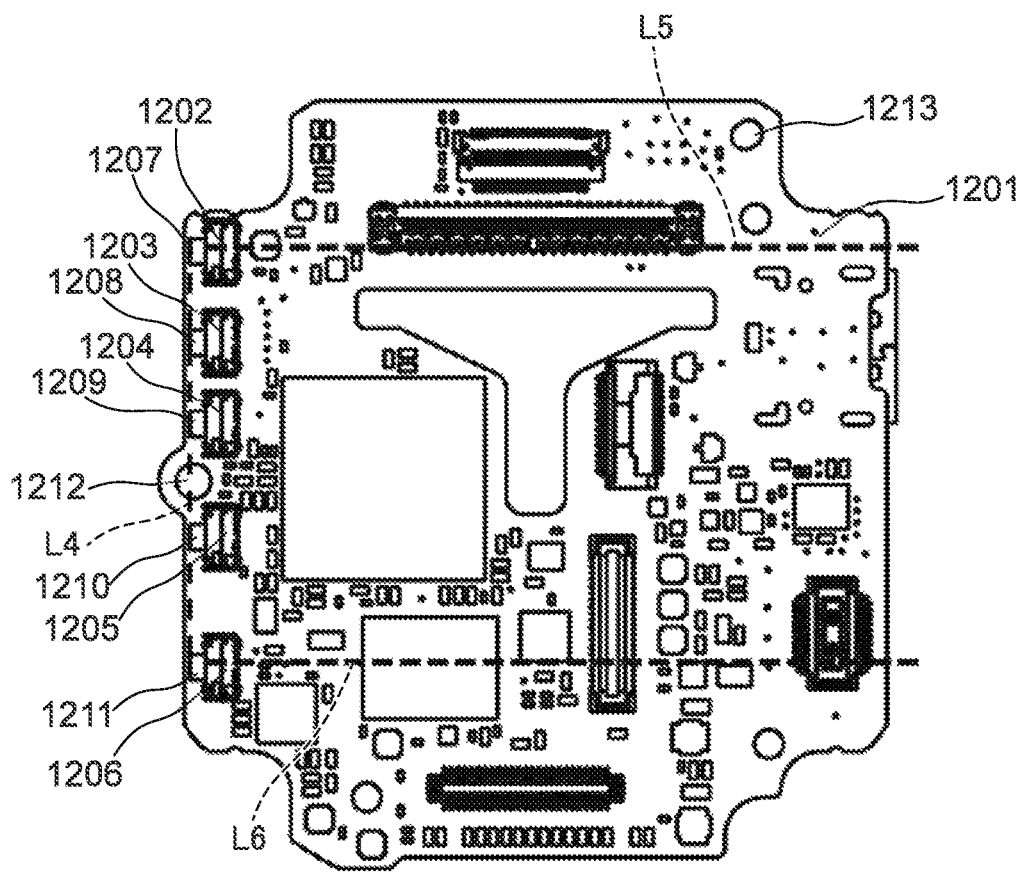
FIG. 13 is a plan view of a main control circuit board as a component of an image capturing apparatus as an electronic apparatus according to a third embodiment of the present invention.

Next, a third embodiment of the present invention will be described. In the third embodiment, a description will be given of a main control circuit board 1201 as another embodiment of the main control circuit board 1104 which is a component of the image capturing apparatus 1000, described in the second embodiment. FIG. 13 is a view of the appearance of the main control circuit board 1201 of the third embodiment.

The main control circuit board 1104 of the second embodiment has two push-in switches, i.e. the power switch 1123 and the operation switch 1124, mounted thereon. On the other hand, the main control circuit board 1201 of the third embodiment has five push-in switches, i.e. a first switch 1202, a second switch 1203, a third switch 1204, a fourth switch 1205, and a fifth switch 1206, mounted thereon.

Similar to the power switch 1123, the first switch 1202 has a first switch pushed portion 1207, and the second switch 1203 has a second switch pushed portion 1208. Further, the third switch 1204, the fourth switch 1205, and the fifth switch 1206 have a third switch pushed portion 1209, a fourth switch pushed portion 1210, and a fifth switch pushed portion 1211, respectively.

Note that the configuration and the arrangement form of push buttons arranged on the exterior member in one-to-one relation with the first to fifth switches 1202 to 1206, respectively, are formed in accordance with the configuration and the arrangement form of the power button 1107 which is the push button arranged on the exterior member 113 in the first embodiment. Therefore, description of these is omitted. Further, the components of the image capturing apparatus in the third embodiment are the same as the components of the image capturing apparatus 1000 according to the second embodiment except the main control circuit board 1201, and hence description of those except the main control circuit board 1201 is omitted.

The main control circuit board 1201 is formed with a positioning hole 1212 and a rotation stopper hole 1213. The positioning hole 1212 and the rotation stopper hole 1213 play the same roles as the positioning hole 1126 and the rotation stopper hole 1127 formed in the main control circuit board 1104 of the second embodiment.

The respective tip ends of the first switch pushed portion 1207, the second switch pushed portion 1208, the third switch pushed portion 1209, the fourth switch pushed portion 1210, and the fifth switch pushed portion 1211 are arranged on a straight line indicated by a broken line L4 in FIG. 13. Further, the positioning hole 1212 is arranged at a location between the third switch 1204 which is disposed in a central portion (vicinity of the center) of the five push-in switches, and the fourth switch 1205 which is disposed adjacent to the third switch 1204, where part of the positioning hole 1212 crosses the broken line L4. With this, respective distances between the pushed portions of the five push-in switches and the positioning hole 1212 are reduced, whereby it is possible to improve the positioning accuracy between the pushed portions of the five push-in switches and the five push buttons. Further, since the positioning hole 1212 for inserting the positioning column 1117 that receives a force which would deform the main control circuit board 1201 when each push button is operated is disposed as described above, it is possible to prevent the main control circuit board 1201 from being deformed. Therefore, positional displacement of each push-in switch, caused by an operation of an associated push button, is reduced.

Next, the arrangement of the rotation stopper hole 1213 will be described. An extended line (straight line) of a vector of a force applied when the first switch 1202 which is disposed at one end of the five push-in switches arranged along the broken line L4 is pushed in is represented by a broken line L5 in FIG. 13. Further, an extended line (straight line) of a vector of a force applied when the fifth switch 1206 which is disposed at the other end of the five push-in switches is pushed in is represented by a broken line L6 in FIG. 13.

The rotation stopper hole 1213 through which the rotation stopper column 1118 is inserted is disposed outside an area sandwiched between the broken line L5 and the broken line L6. This is for the following reason: Similar to the second embodiment, the rotation stopper column 1118 and the rotation stopper hole 1213 are spaced from each other by a fixed distance along a line connecting between the center of the positioning hole 1212 and the center of the rotation stopper hole 1213. Therefore, if the rotation stopper column 1118 is disposed in the area sandwiched between the broken line L5 and the broken line L6, the force cannot be received by the rotation stopper column 1118. To prevent this problem from occurring, the rotation stopper column 1118 is disposed outside the area sandwiched between the broken line L5 and the broken line L6. Thus, also in the third embodiment, it is possible to obtain the same advantageous effects as provided by the second embodiment.

Note that although in the second and third embodiments, the description is given of the image capturing apparatus by way of example, the present invention can be applied to any other electronic apparatus, insofar as it is an electronic apparatus provided with a plurality of push-in switches pushed in a direction parallel to a main flat surface of a circuit board on which the push-in switches are mounted. For example, the electronic apparatuses to which the present invention can be applied include a smartphone, a personal computer, and a tablet terminal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-163800, filed Sep. 29, 2020, which is hereby incorporated by reference herein in its entirety.

What is claimed is:

1. An electronic apparatus comprising:
a mounting base unit;
a movable section rotatably held by the mounting base unit; and
a circuit board unit on which circuit components including a tall electronic component are mounted,
wherein the mounting base unit includes:
a drive unit configured to drive the movable section; and
a detection unit configured to detect an amount of rotation of the movable section,
wherein the mounting base unit and the circuit board unit are arranged such that the mounting base unit and the circuit board unit are opposed to each other in a first direction perpendicular to an installation surface of the electronic apparatus,
wherein the tall electronic component is mounted on a mounting surface, which is opposed to the mounting base unit, of the circuit board unit, and the tall electronic component is mounted at a location where in a projection view in the first direction, the tall electronic component does not overlap the drive unit and the detection unit, and
wherein in a projection view in a second direction orthogonal to the first direction, the tall electronic component and the detection unit at least partially overlap each other.

2. The electronic apparatus according to claim 1, wherein in a projection view in a second direction orthogonal to the first direction, the tall electronic component and the drive unit at least partially overlap each other.

3. An electronic apparatus comprising:
a mounting base unit;
a movable section rotatably held by the mounting base unit; and
a circuit board unit on which circuit components including a tall electronic component are mounted,
wherein the mounting base unit includes:
a drive unit configured to drive the movable section; and
a detection unit configured to detect an amount of rotation of the movable section,
wherein the mounting base unit and the circuit board unit are arranged such that the mounting base unit and the circuit board unit are opposed to each other in a first direction perpendicular to an installation surface of the electronic apparatus,
wherein the tall electronic component is mounted on a mounting surface, which is opposed to the mounting base unit, of the circuit board unit, and the tall electronic component is mounted at a location where in a projection view in the first direction, the tall electronic component does not overlap the drive unit and the detection unit,
wherein the mounting base unit has a substantially annular mounting base,
wherein the mounting base includes:
a central opening for holding the movable section such that the movable section is rotatable about a rotation axis parallel to the first direction, and
a first opening, a second opening, and a third opening, which are formed around the central opening,
wherein the drive unit is fixed to the mounting base such that at least part of the drive unit enters the first opening,
wherein the detection unit is fixed to the mounting base such that at least part of the detection unit enters the second opening, and
wherein the tall electronic component is disposed such that at least part of the tall electronic component is close to a wall surface of the third opening.

4. An electronic apparatus comprising:
a mounting base unit;
a movable section rotatably held by the mounting base unit; and
a circuit board unit on which circuit components including a tall electronic component are mounted,
wherein the mounting base unit includes:
a drive unit configured to drive the movable section; and
a detection unit configured to detect an amount of rotation of the movable section,
wherein the mounting base unit and the circuit board unit are arranged such that the mounting base unit and the circuit board unit are opposed to each other in a first direction perpendicular to an installation surface of the electronic apparatus,
wherein the tall electronic component is mounted on a mounting surface, which is opposed to the mounting base unit, of the circuit board unit, and the tall electronic component is mounted at a location where in a projection view in the first direction, the tall electronic component does not overlap the drive unit and the detection unit,
wherein the circuit board unit includes:
a first circuit board, and
a second circuit board on which the tall electronic component is mounted, and
wherein the first circuit board, the second circuit board, and the mounting base unit are arranged such that the first circuit board, the second circuit board, and the mounting base unit are layered in the mentioned order in the first direction.

5. The electronic apparatus according to claim 4, wherein the circuit board unit includes:
a connector mounted on a mounting surface, which is opposed to the mounting base unit, of the second circuit board, and a first wiring member that is connected to the connector to electrically connect between the first circuit board and the second circuit board, and wherein the connector is mounted at a location where in a projection view in the first direction, the connector does not overlap the drive unit, the detection unit, and the tall electronic component.

6. The electronic apparatus according to claim 4, further comprising:
a battery accommodating portion that is arranged under the circuit board unit in the first direction and accommodates a battery for supplying electric power to the circuit board unit, and
a second wiring member that is disposed between the first circuit board and the battery accommodating portion to electrically connect between the first circuit board and the battery.

7. The electronic apparatus according to claim 4, further comprising:
a third wiring member that electrically connects between electronic components provided on the movable section, and the first circuit board, and
a fourth wiring member that electrically connects between the drive unit or the detection unit and the second circuit board.

8. The electronic apparatus according to claim 7, wherein the third wiring member is connected to a mounting surface of the first circuit board on a side toward a bottom of the electronic apparatus.

9. The electronic apparatus according to claim 4, wherein wiring density of a circuit pattern formed on the first circuit board is higher than wiring density of a circuit pattern formed on the second circuit board.

10. The electronic apparatus according to claim 4, wherein the number of layers of circuit patterns formed on the first circuit board is larger than the number of layers of circuit patterns formed on the second circuit board.

11. An electronic apparatus comprising:
a mounting base unit;
a movable section rotatably held by the mounting base unit; and
a circuit board unit on which circuit components including a tall electronic component are mounted,
wherein the mounting base unit includes:
a drive unit configured to drive the movable section; and
a detection unit configured to detect an amount of rotation of the movable section,
wherein the mounting base unit and the circuit board unit are arranged such that the mounting base unit and the circuit board unit are opposed to each other in a first direction perpendicular to an installation surface of the electronic apparatus,
wherein the tall electronic component is mounted on a mounting surface, which is opposed to the mounting base unit, of the circuit board unit, and the tall electronic component is mounted at a location where in a projection view in the first direction, the tall electronic component does not overlap the drive unit and the detection unit, and
wherein the tall electronic component is one of a transformer, an inductor, a capacitor, and a common mode filter.

12. An electronic apparatus comprising:
a circuit board having a plurality of push-in switches mounted on the same surface thereof;
an exterior member that accommodates the circuit board; and
a plurality of operation buttons that are mounted on the exterior member in one-to-one relation with the plurality of push-in switches, each for pushing in an associated one of the push-in switches,
wherein the circuit board has a first hole,
wherein the exterior member has a first column portion inserted through the first hole,
wherein the plurality of push-in switches each have a pushed portion that detects an operation of pushing in an associated one of the operation buttons,
wherein directions in which the plurality of push-in switches are pushed in are parallel to a mounting surface of the circuit board, and also tip ends of the pushed portions of the plurality of push-in switches are positioned in a straight line,
wherein the first hole is formed at a location where at least part of the first hole crosses the straight line in an area between two push-in switches, which are arranged in a central portion, of the plurality of push-in switches,
wherein the exterior member has a plurality of accommodating portions for accommodating the plurality of operation buttons, respectively,
wherein the circuit board has a protruding portion that protrudes toward an area between wall portions that define the plurality of accommodating portions, respectively, and
wherein the first hole is formed such that at least part of the first hole is included in the protruding portion.

13. An electronic apparatus comprising:
a circuit board having a plurality of push-in switches mounted on the same surface thereof;
an exterior member that accommodates the circuit board; and
a plurality of operation buttons that are mounted on the exterior member in one-to-one relation with the plurality of push-in switches, each for pushing in an associated one of the push-in switches,
wherein the circuit board has a first hole,
wherein the exterior member has a first column portion inserted through the first hole,
wherein the plurality of push-in switches each have a pushed portion that detects an operation of pushing in an associated one of the operation buttons,
wherein directions in which the plurality of push-in switches are pushed in are parallel to a mounting surface of the circuit board, and also tip ends of the pushed portions of the plurality of push-in switches are positioned in a straight line, and
wherein the first hole is formed at a location where at least part of the first hole crosses the straight line in an area between two push-in switches, which are arranged in a central portion, of the plurality of push-in switches,
wherein the circuit board has a second hole,
wherein the exterior member has a second column portion inserted through the second hole,
wherein the first hole is formed into a substantially perfect circle,
wherein the second hole is formed into a long hole shape formed by connecting semi-circular shapes by two line segments parallel to each other,
wherein the first column portion is a cylindrical portion of which a cross section orthogonal to a longitudinal direction thereof has substantially the same shape as the first hole,
wherein the second column portion is a cylindrical portion which is in contact with the two line segments parallel to each other, wherein the two line segments parallel to each other, which form the second hole, are parallel to a line connecting between a center of the first hole and a center of the second hole, wherein the second column portion is spaced from inner walls of the semi-circular shapes forming the second hole by a fixed distance, and wherein the first column portion is larger in diameter than the second column portion.

14. The electronic apparatus according to claim 13, wherein the second column portion is provided integrally with the exterior member.

15. The electronic apparatus according to claim 13, wherein directions in which the plurality of push-in switches are pushed in, respectively, are parallel to each other, and wherein the second hole is formed outside an area sandwiched between extended lines of vectors of forces applied when two push-in switches, which are disposed outermost, of the plurality of push-in switches are pushed in, respectively.

* * * * *